(12) United States Patent
Nakamura

(10) Patent No.: US 9,300,306 B2
(45) Date of Patent: *Mar. 29, 2016

(54) DIGITALLY CONTROLLED OSCILLATOR DEVICE AND HIGH FREQUENCY SIGNAL PROCESSING DEVICE

(71) Applicant: Renesas Electronics Corporation, Tokyo (JP)

(72) Inventor: Takahiro Nakamura, Kodaira (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/513,644

(22) Filed: Oct. 14, 2014

(65) Prior Publication Data

US 2015/0028926 A1 Jan. 29, 2015

Related U.S. Application Data

(63) Continuation of application No. 13/651,390, filed on Oct. 13, 2012, now Pat. No. 8,884,708.

(30) Foreign Application Priority Data

Oct. 13, 2011 (JP) ................................. 2011-225598

(51) Int. Cl.
*H03L 7/10* (2006.01)
*H03L 7/107* (2006.01)
(Continued)

(52) U.S. Cl.
CPC ............ *H03L 7/1075* (2013.01); *H03B 5/1212* (2013.01); *H03B 5/1228* (2013.01);
(Continued)

(58) Field of Classification Search
CPC ...................................................... H03L 7/1075
USPC ....... 331/108 A, 117 FE, 167, 177 V, 36 C, 34
See application file for complete search history.

(56) References Cited

U.S. PATENT DOCUMENTS 7,403,147 B2   7/2008   Klaassen
7,576,382 B2   8/2009   Ueno
(Continued)

FOREIGN PATENT DOCUMENTS

| JP | 08-274167 A | 10/1996 |
|----|-------------|---------|
| JP | 2006-245551 A | 9/2006 |
| JP | 2010-056856 A | 3/2010 |

OTHER PUBLICATIONS

Chih-Ming Hung et al., "A Digitally Controlled Oscillator System for SAW-Less Transmitters in Cellular Handsets", IEEE Journal of Solid-State Circuits, vol. 41, No. 5, pp. 1160-1170, May 2006.

(Continued)

*Primary Examiner* — Joseph Chang
(74) *Attorney, Agent, or Firm* — Shapiro, Gabor and Rosenberger, PLLC

(57) ABSTRACT

The present invention provides a digitally controlled oscillator device capable of realizing a reduction in DNL. The digitally controlled oscillator device includes, for example, an amplifier circuit block, coil elements and a plurality of unitary capacitor units coupled in parallel between oscillation output nodes. Each of the unitary capacitor units is provided with capacitive elements, and a switch which selects whether the capacitive elements should be allowed to contribute as set parameters for an oscillation frequency. The switch is driven by an on/off control line extending from a decoder circuit. The on/off control line is shielded between the oscillation output nodes by a shield section.

8 Claims, 18 Drawing Sheets

(51) Int. Cl.
    *H03L 7/02* (2006.01)
    *H03L 7/099* (2006.01)
    *H03B 5/12* (2006.01)
    *H03L 7/093* (2006.01)
    *H03L 7/185* (2006.01)
    *H04B 1/16* (2006.01)

(52) U.S. Cl.
    CPC ............... *H03B5/1265* (2013.01); *H03L 7/02* (2013.01); *H03L 7/093* (2013.01); *H03L 7/099* (2013.01); *H03L 7/0991* (2013.01); *H03L 7/185* (2013.01); *H03L 2207/05* (2013.01); *H03L 2207/12* (2013.01); *H03L 2207/50* (2013.01); *H04B 1/16* (2013.01)

(56) References Cited

U.S. PATENT DOCUMENTS

| | | | |
|---|---|---|---|
| 7,715,836 | B2* | 5/2010 | Vassiliou et al. ............ 455/423 |
| 2002/0033741 | A1 | 3/2002 | Craninckx et al. |
| 2008/0122670 | A1 | 5/2008 | Klaassen |
| 2009/0184771 | A1 | 7/2009 | Barton et al. |
| 2009/0322436 | A1 | 12/2009 | Hosoya et al. |
| 2010/0052795 | A1 | 3/2010 | Nakamura et al. |

OTHER PUBLICATIONS

Office Action issued Aug. 11, 2015, in Japanese Patent Application No. 2011-225598.

* cited by examiner

DIGITALLY CONTROLLED OSCILLATOR DEVICE AND HIGH FREQUENCY SIGNAL PROCESSING DEVICE

CROSS-REFERENCE TO RELATED APPLICATIONS

The disclosure of Japanese Patent Application No. 2011-225598 filed on Oct. 13, 2011 including the specification, drawings and abstract is incorporated herein by reference in its entirety.

BACKGROUND

The present invention relates to a digitally controlled oscillator device and a high frequency signal processing device, and particularly to a technology effective when applied to a DCO (Digitally controlled oscillator) circuit for a wireless communication system, a PLL (Phase Locked Loop) circuit including the DCO circuit, and a wireless communication high frequency signal processing device including the PLL circuit.

A DCO system to which a system called "dynamic element matching" has been applied, has been shown in, for example, a Non-Patent Document 1. The dynamic element matching is such a technology that a method of selecting capacitors coupled to oscillation nodes is devised to thereby suppress a variation in capacitance value between the capacitors on an average basis. Consequently, an improvement in DNL (Differential Non Linearity) is achieved.

RELATED ART DOCUMENTS

[Non-Patent Document 1] Chih-Ming Hung and four more inventors, "A Digitally Controlled Oscillator System for SAW-Less Transmitters in Cellular Handsets", IEEE JOURNAL OF SOLID-STATE CIRCUITS, VOL. 41, NO. 5, p. 1160-1170, May 2006.

SUMMARY

For example, a wireless communication system typified by a cellular phone is equipped with a high frequency signal processing device which mainly assumes frequency conversion between each baseband signal and a high frequency signal. This type of high frequency signal processing device is equipped with, for example, a PLL circuit, a mixer circuit and so on and performs frequency conversion by inputting carrier signals (local signal, local oscillation signal) for transmission/reception generated by the PLL circuit to the mixer circuit. Under such circumstances, attention has been focused on a technology which replaces an analog PLL circuit that has heretofore been widely used with a digital PLL circuit configured by a digital circuit. The digital PLL circuit is also called ADPLL (All Digital Phase Locked Loop) or the like. For example, a scale-down technology based on a CMOS (Complementary Metal Oxide Semiconductor) process can be enjoyed when the digital PLL circuit is used. It is therefore possible to achieve a decrease in area, a reduction in power supply voltage, an improvement in performance (speeding-up) and the like as the technology progresses.

In the digital PLL circuit, a DCO circuit is used in its oscillation circuit section. For example, a DCO circuit for a wireless communication system is normally configured by an LC resonant type and sequentially controls the value (concretely, the number of capacitors coupled to oscillation nodes) of this C (capacitor) according to a digital code to thereby control an oscillation frequency. It is thus desirable that the relationship between the digital code and the value of C (capacitor) is linear in the DCO circuit. When this linearity is degraded (i.e., DNL (or INL (Integral Non Linearity)) increases), a transmitting circuit is in danger of causing problems such as an increase in the phase error in a transmission signal and degeneration in spectrum. A receiving circuit is in danger of causing problems such as deterioration in the quality of a reception signal after frequency conversion (down-conversion), etc. because a 3 MHz-detuned phase nose characteristic in the DCO circuit cannot reach the spec based on the communication standard.

In order to reduce DNL, it is considered that such a dynamic element matching system as described in, for example, the Non-Patent Document 1 is used. There is however a case where when the present system is used, calibration is required at the start-up or the like of the DCO circuit to optimize a method of selecting each capacitor, for example. Although a certain degree of improvement in DNL by the present system has been achieved, desirably, reducing a variation itself in capacitance value between capacitors coupled to each oscillation node basically becomes more profitable in terms of a reduction in DNL.

Under such circumstances, it has been demonstrated by the present inventors et al. that the parasitic capacitance added to each oscillation node becomes a main factor as to the degeneration in DNL. Thus, an object of the present invention is to provide a digitally controlled oscillator device capable of achieving a reduction in DNL, and a high frequency signal processing device capable of improving the quality of transmission and reception signals. The above, other objects and novel features of the present invention will become apparent from the description of the present specification and the accompanying drawings.

A summary of a typical embodiment of the inventions disclosed in the present application will be explained in brief as follows:

A digitally controlled oscillator device according to the present embodiment is equipped with first and second oscillation output nodes from which complementary oscillation output signals are output, coil elements, a plurality of capacitor units, a negative resistance generating circuit and a control circuit. The coil elements (LP, LM) are coupled between the first oscillation output node (OscP) and the second oscillation output node (OscM). The capacitor units (CIUs) are coupled in parallel between the first oscillation output node and the second oscillation output node. The negative resistance generating circuit (AMPBK) generates a negative resistance between the first oscillation output node and the second oscillation output node. Each of the capacitor units includes capacitive elements (CIp, CIm), and a control node (BITND) which selects whether the capacitive elements are coupled to the first and second oscillation output nodes as set parameters for an oscillation frequency. The control circuit (LOG) drives the respective control nodes in the capacitor units through a plurality of control lines (BIT_CI). Here, a first shield layer (GS) is disposed between the control lines and the first and second oscillation output nodes in such a way as to effectively shield between these.

Thus, it is possible to suppress the situation that the impedance at the first and second oscillation output nodes varies irregularly according to the driven states of the control lines by the control circuit, thereby making it possible to achieve a reduction in DNL. The high frequency signal process by the present embodiment takes such a configuration that upconversion of baseband signals and the like are performed using such a digitally controlled oscillator device as described above. It is thus possible to realize an improvement in the quality of a transmission signal.

Advantageous effects obtained by a typical embodiment of the inventions disclosed in the present application will be explained in brief. A reduction in DNL can be realized in a digitally controlled oscillator device. An improvement in the quality of transmission and reception signals can be achieved in a high frequency signal processing device.

DETAILED DESCRIPTION

Figure 1:
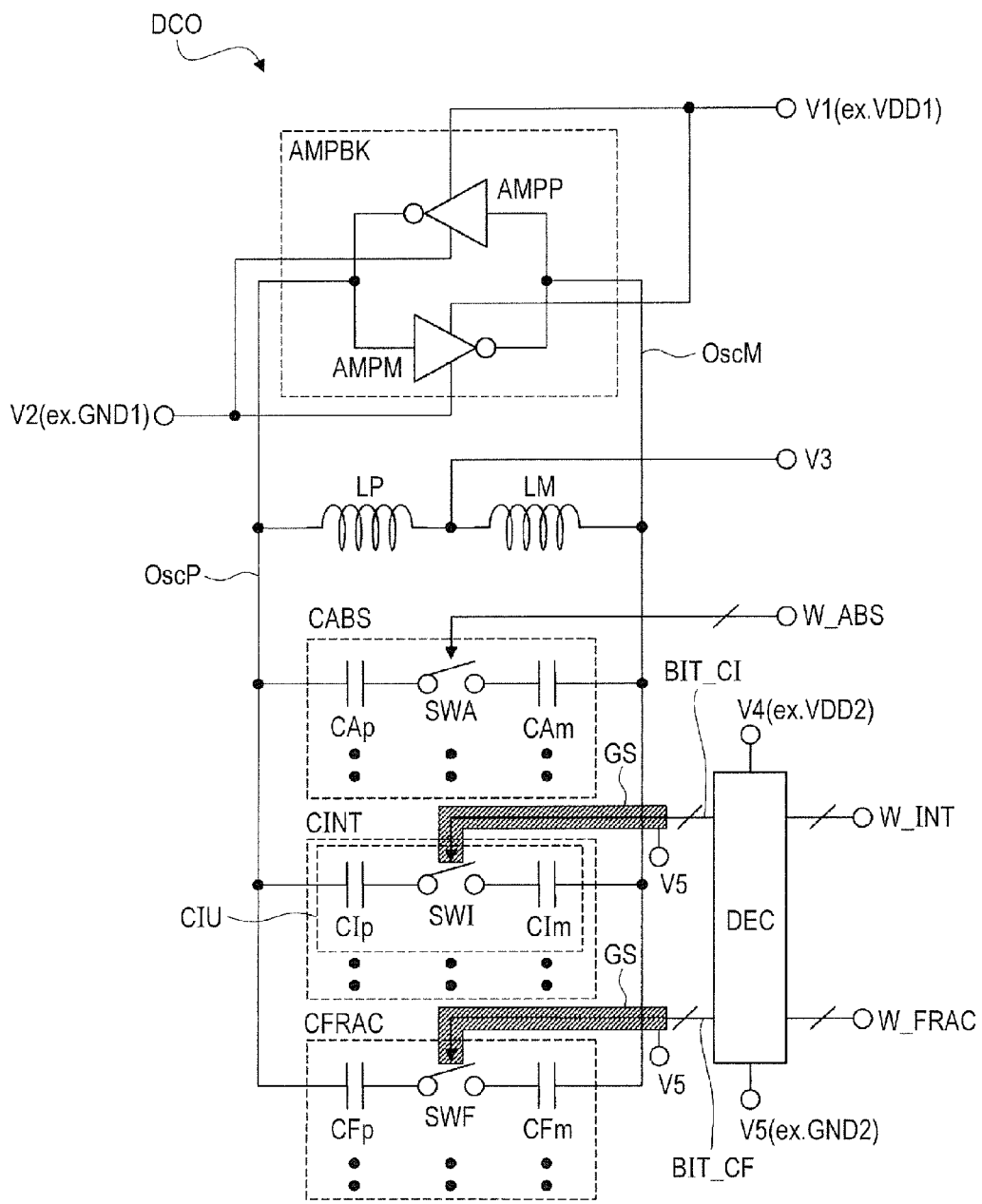
FIG. 1 is a circuit diagram showing a schematic configuration example of a digitally controlled oscillator circuit included in a digitally controlled oscillator device according to a first embodiment of the present invention.

Whenever circumstances require it for convenience in the following embodiments, the subject matter will be described by being divided into a plurality of sections or embodiments. However, unless otherwise specified in particular, they are not irrelevant to one another. One thereof has to do with modifications, details, supplementary explanations and the like of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Circuit elements that configure respective functional blocks of the embodiments are not limited in particular, but formed over a semiconductor substrate like monocrystalline silicon by an IC technology of known CMOS (complementary MOS transistors) or the like. Incidentally, MOSFETs (Metal Oxide Semiconductor Field Effect Transistors) (abbreviated as MOS transistors) are used as one example of MOSFETs (Metal Insulator Semiconductor Field Effect Transistors), but a non-oxide film will not be excluded as a gate insulating film.

Preferred embodiments of the present invention will hereinafter be described in detail based on the accompanying drawings. Incidentally, the same reference numerals are respectively attached to the same components or members in principle in all the drawings for describing the embodiments, and their repetitive description will be omitted.

First Embodiment

Schematic Circuit Configuration of Digitally Controlled Oscillator Circuit

FIG. 1 is a circuit diagram showing a schematic configuration example of a digitally controlled oscillator circuit included in a digitally controlled oscillator device according to a first embodiment of the present invention. The digitally controlled oscillator circuit DCO shown in FIG. 1 is equipped with an amplifier circuit block AMPBK, coil elements LP and LM, capacitor banks of three systems CABS, CINT and CFRAC, and a decoder circuit DEC. The amplifier circuit block AMPBK functions as a negative resistance circuit and has an amplifier circuit AMPM that performs an inverse operation with an oscillation output node OscP on the positive polarity side taken as an input and an oscillation output node OscM on the negative polarity side taken as an output, and an amplifier circuit AMPP that performs an inverse operation with the oscillation output node OscM taken as the input and the oscillation output node OscP taken as the output in reverse.

While the amplifier circuits AMPP and AMPM are respectively not limited in particular, they are respectively comprised of typically a CMOS inverter circuit made up of a PMOS transistor and an NMOS transistor. Each of the amplifier circuits AMPP and AMPM is operated by a fixed voltage (e.g., a power supply voltage VDD1) V1 on the high potential side, and a fixed voltage (e.g., a ground power supply voltage GND1) V2 on the low potential side. Incidentally, each of the amplifier circuits AMPP and AMPM can also be comprised of one NMOS transistor as the case may be (that is, the amplifier circuit block AMPBK may be comprised of two NMOS transistors (gate of one thereof is coupled to its corresponding drain of the other thereof) cross-coupled). The coil element LP has one end coupled to the oscillation output node OscP. The coil element LM has one end coupled to the oscillation output node OscM. The other ends of the coil elements LP and LM are supplied with a fixed voltage (e.g., VDD1 or GND1) V3.

The capacitor bank CABS has a capacitive element CAp whose one end is coupled to the oscillation output node OscP, a capacitive element CAm whose one end is coupled to the oscillation output node OscM, and a switch SWA coupled between the other end of the capacitive element CAp and the other end of the capacitive element CAm. Although a set of circuits comprised of the capacitive element CAp, the switch SWA and the capacitive element CAm is typically shown herein, such circuits are actually provided as plural sets between the oscillation output nodes OscP and OscM. Likewise, the capacitor bank CINT has a capacitive element CIp whose one end is coupled to the oscillation output node OscP, a capacitive element CIm whose one end is coupled to the oscillation output node OscM, and a switch SWI coupled between the other end of the capacitive element CIp and the other end of the capacitive element CIm. Actually, such circuits are provided between the oscillation output nodes OscP and OscM as plural sets. The capacitor bank CFRAC also has a capacitive element CFp whose one end is coupled to the oscillation output node OscP, a capacitive element CFm whose one end is coupled to the oscillation output node OscM, and a switch SWF coupled between the other end of the capacitive element CFp and the other end of the capacitive element CFm. Actually, such circuits are provided between the oscillation output nodes OscP and OscM as plural sets.

The switch SWA is controlled in on/off operations by an automatic band control signal W_ABS. The switches SWI and SWF are controlled in on/off operations by the decoder circuit DEC. The decoder circuit DEC is operated by a fixed voltage (e.g., a power supply voltage VDD2) V4 on the high potential side and a fixed voltage (e.g., a ground power supply voltage GND2) V5 on the lower potential side. The decoder circuit DEC receives an integer capacitance value control signal W_INT and a fraction capacitance value control signal W_FRAC as inputs, controls on/off of the switch SWI through an on/off control line (on/off control signal) BIT_CI according to the integer capacitance value control signal W_INT and controls on/off of the switch SWF through an on/off control line (on/off control signal) BIT_CF according to the fraction capacitance value control signal W_FRAC. Here, one set comprised of the capacitive element CIp, the switch SWI and the capacitive element CIm lying within the capacitor bank CINT is called a unitary capacitor unit CIU. Since a plurality of sets of unitary capacitor units CIUs are provided within the capacitor bank CINT as described above, the on/off control line BIT_CI is configured in plural form correspondingly. The on/off control line BIT_CF is also configured in plural form in like manner. The decoder circuit DEC changes by "1" the number of the unitary capacitor units CIUs each controlling the switch SWI to on via the on/off control line BIT_CI each time the value of the integer capacitive value control signal W_INT is changed by "1".

Such a digitally controlled oscillator circuit DCO has an LC resonance type configuration based on the coil elements LP and LM and the respective capacitive elements lying within the capacitor banks CABS, CINT and CFRAC and outputs complementary oscillation output signals to the oscillation output nodes OscP and OscM. At this time, the amplifier circuit block AMPBK functions as a negative resistance circuit that cancels out a parasitic resistive component of the corresponding LC section. The oscillation frequency of the digitally controlled oscillator circuit is controlled by turning on/off of each switch in each of the capacitor banks CABS, CINT and CFRAC. Each capacitive element included in the set in which the switch is controlled to be on principally contributes as a parameter that defines the oscillation frequency. Here, the relationship between the effective capacitance values of the respective capacitive elements in the capacitor banks CABS, CINT and CFRAC is placed in CAp (=CAm)>CIp (=CIm) CFp (=CFm).

Thus, the oscillation frequencies are adjusted in 2 MHz units by the automatic band control signal W_ABS, 10 MHz units by the integer capacitance value control signal W_INT (CINT) and 1.25 kHz units by the fraction capacitance value control signal W-FRAC (CFRAC) respectively. Although not limited in particular, an adjustment of 512 steps (about 1 GHz range) is performed in 2 MHz units in the capacitor bank CABS. An adjustment of 2048 steps (about 20 MHz range) is performed in 10 kHz units in the capacitor bank CINT. Incidentally, for example, the capacitive elements CIp (=CIm) and CFp (=CFm) may respectively be comprised of unitary capacitive elements each having the same capacitance value. In this case, for example, when the time taken to drive the capacitive element CFp (=CFm) to on, is set to ⅛ of the time taken to drive the capacitive element CIp (=CIm) to on, the effective (average) capacitance value (span of adjustable range for the oscillation frequency) becomes ⅛ of that for the capacitive element CIp (=CIm).

In such a configuration example, one of the major features of the digitally controlled oscillator device according to the first embodiment resides in that the on/off control lines BIT_CI and BIT_CF are protected by shield sections GS over the layout. Another thereof resides in that the same fixed voltage (e.g., ground power supply voltage GND2) V5 as that for the decoder circuit DEC without depending on the amplifier circuits AMPP and AMPM is supplied to the corresponding shield sections GS. It has been demonstrated by the discussions of the present inventors et al. that degeneration of differential non linearity DNL (or INL) in the DCO circuit occurs with variations in the parasitic capacitance between the on/off control lines BIT_CI and BIT_CF and the oscillation output nodes OscP and OscM in FIG. 1 as a principal factor. Thus, although the details thereof are described later, a reduction in the differential non linearity DNL (or INL) becomes feasible by the provision of the shield sections GS.

<<Detailed Configuration of Switch>>

Figure 2:
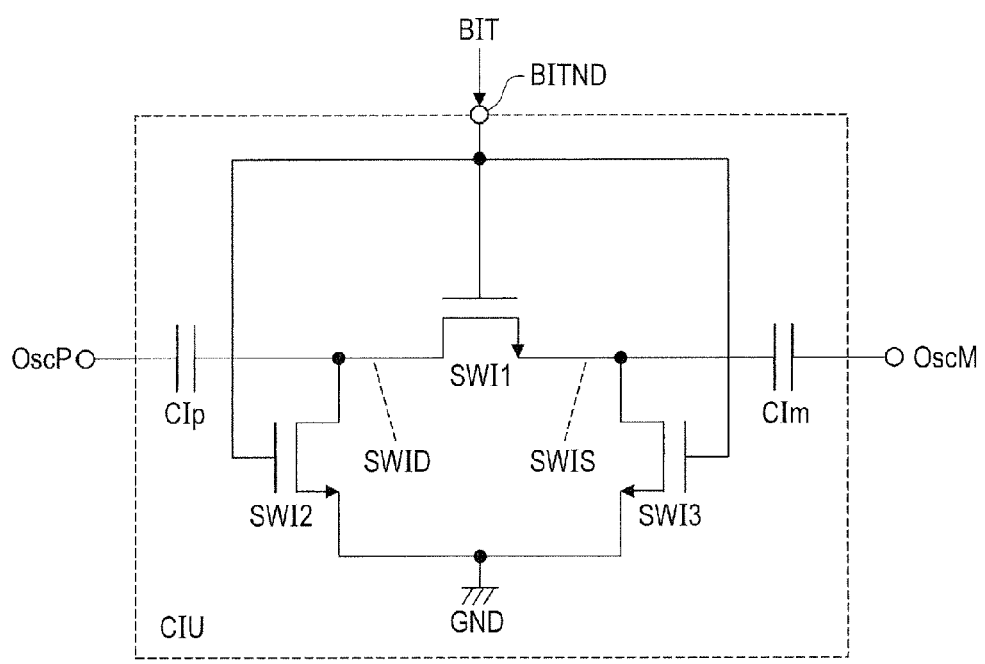
FIG. 2 is a circuit diagram illustrating a detailed configuration example of the periphery of a switch in each unitary capacitor unit in the digitally controlled oscillator circuit shown in FIG. 1.

FIG. 2 is a circuit diagram showing a detailed configuration example of the periphery of a switch in each unitary capacitor unit in the digitally controlled oscillator circuit shown in FIG. 1. A configuration example of one unitary capacitor unit CIU lying in the capacitor bank CINT shown in FIG. 1 is shown as typical. In the example of FIG. 2, the switch SWI is comprised of three switches SWI1 through SWI3 provided between the capacitive elements CIp and CIm. The switch SWI1 is comprised of an NMOS transistor whose source-to-drain path is formed between one end (node SWID) of the capacitive element CIp and one end (node SWIS) of the capacitive element CIm. The switch SWI2 is comprised of an NMOS transistor whose source-to-drain path is formed between the node SWID and the ground power supply voltage GND. The switch SWI3 is comprised of an NMOS transistor whose source-to-drain path is formed between the node SWIS and the ground power supply voltage GND. As the ground power supply voltage GND, for example, the ground power supply voltage GND2 shown in FIG. 1 is used. The gates of the NMOS transistors that respectively configure the switches SWI1 through SWI3 are coupled to an on/off control node BITND included in the unitary capacitor unit CIU. This BITND is driven by the above-described on/off control line BIT (BIT_CI in FIG. 1).

When the on/off control line BIT is driven to an 'H' level here, the nodes SWID and SWIS are electrically coupled to each other and short-circuited to the ground power supply voltage GND. In this case, the capacitive elements CIp and CIm contribute as parameters at the time that the oscillation frequency is set at the oscillation output nodes OscP and OscM. On the other hand, when the on/off control line BIT is driven to an 'L' level, the nodes SWID and SWIS are electrically isolated from each other and respectively brought into a high impedance state. In this case, the capacitive element CIp and CIm ideally do not contribute as parameters at the time that the oscillation frequency is set. That is, the on/off control node BITND has the function of selecting whether the capacitive elements CIp and CIm should be allowed to contribute as the parameters at the time that the oscillation frequency is set.

Figure 3:
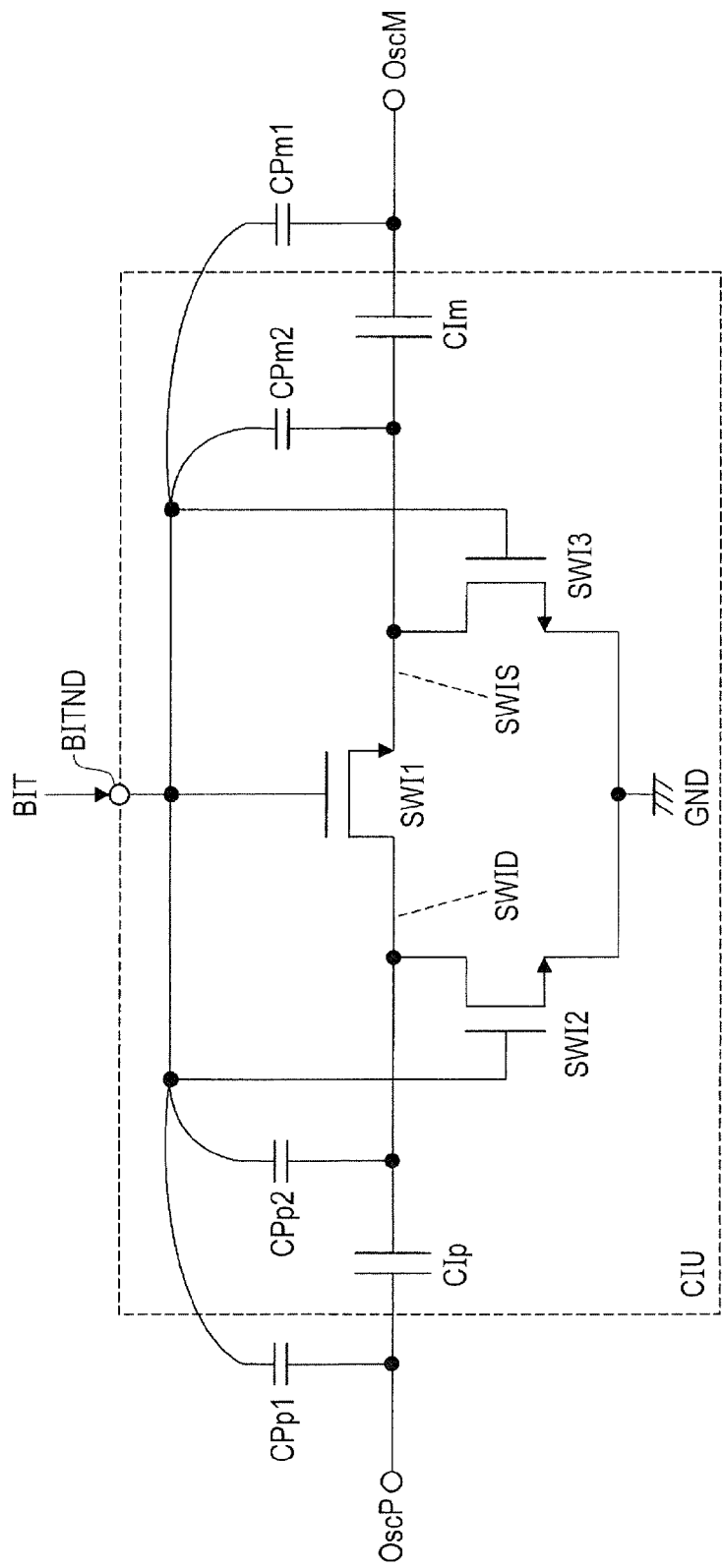
FIG. 3 is an explanatory diagram depicting one example illustrative of parasitic capacitances in the unitary capacitor unit of FIG. 2.

When the on/off control line BIT is driven to the 'L' level as described above, the capacitive elements CIp and CIm ideally do not contribute as the parameters for the setting of the oscillation frequency, but may strictly affect the oscillation frequency according to the combination with the parasitic capacitances. FIG. 3 is an explanatory diagram showing one example illustrative of parasitic capacitances of each unitary capacitor unit of FIG. 2. In each unitary capacitor unit CIU as shown in FIG. 3, parasitic capacitances CPp1 and CPm1 respectively exist between the on/off control line BIT (on/off control node BITND) and the oscillation output nodes OscP and OscM. Parasitic capacitances CPp2 and CPm2 respectively exist between the on/off control line BIT (BITND) and the nodes SWID and SWIS. When the on/off control line BIT is brought to the 'L' level (i.e., the nodes SWID and SWIS are respectively in the high impedance state), the parasitic capacitances CPp2 and CPm2 of these can affect the oscillation frequency according to the combination with the capacitive elements CIp and CIm.

The parasitic capacitances CPp2 and CPm2 however principally assume parasitic capacitances generated inside each unitary capacitor unit CIU. It is therefore possible to relatively easily reduce variations in the capacitance values of the parasitic capacitances CPp2 and CPm2 between the individual CIU by using the same layout configuration of CIU. They are not so much of a problem in terms of the digital non linearity DNL. On the other hand, the parasitic capacitances CPp1 and CPm1 principally become parasitic capacitances that occur outside the unitary capacitor unit CIU. Therefore, the variations in the capacitance values of the parasitic capacitances CPp1 and CPm1 between each CIU are not easily reduced because the on/off control line BIT and the oscillation output nodes OscP and OscM are different in relative layout relation every CIU. Therefore, each on/off control line BIT is protected by the shield section GS as described above, so that the variations in the capacitance values of the parasitic capacitances CPp1 an CPm1 every CIU can be reduced in particular as well as the parasitic capacitances CPp2 and CPm2.

Incidentally, of course, the configuration of the switch SWI is not limited to such a configuration as shown in FIG. 2, but can be modified in various ways. In FIG. 2, for example, the nodes SWID and SWIS are assumed to be virtually grounded on an AC basis in principle by driving the switch SWI1 to On. The switches SWI2 and SWI3 become therefore unnecessary. Since a mismatch in differential balance and an error from the virtual ground according to the time constant of the switch SWI1 and the like actually occur, switches (switches SWI2 and SWI3 in the example of FIG. 2) that allow the nodes SWID and SWIS to be grounded on an AC basis may desirably be provided.

Although the capacitive elements CIp and CIm are predicated on an MIM (Metal Insulator Metal) capacitor, an MOM (Metal Oxide Metal) capacitor and the like in FIG. 2, the switch SWI1 may be omitted where the MOS capacitor and the like are used. That is, the source and drain of a MOS are coupled to each other to configure a capacitive element between a connecting node thereof and the gate of the MOS. In this case, one end of the capacitive element is directly coupled to the on/off control node BITND, and the voltage level of the on/off control node BITND is controlled by the on/off control line BIT, so that the function substantially similar to the switch SWI can be realized. While the shield system of each on/off control line by the first embodiment brings about an advantageous effect similar even where such MOS capacitor and like are applied, the MIM capacitor, the MOM capacitor and the like may desirably be used in terms of a reduction in variation of the characteristics of each capacitive element itself.

<<Layout Outline of Capacitor Bank [1]>>

Figure 4:
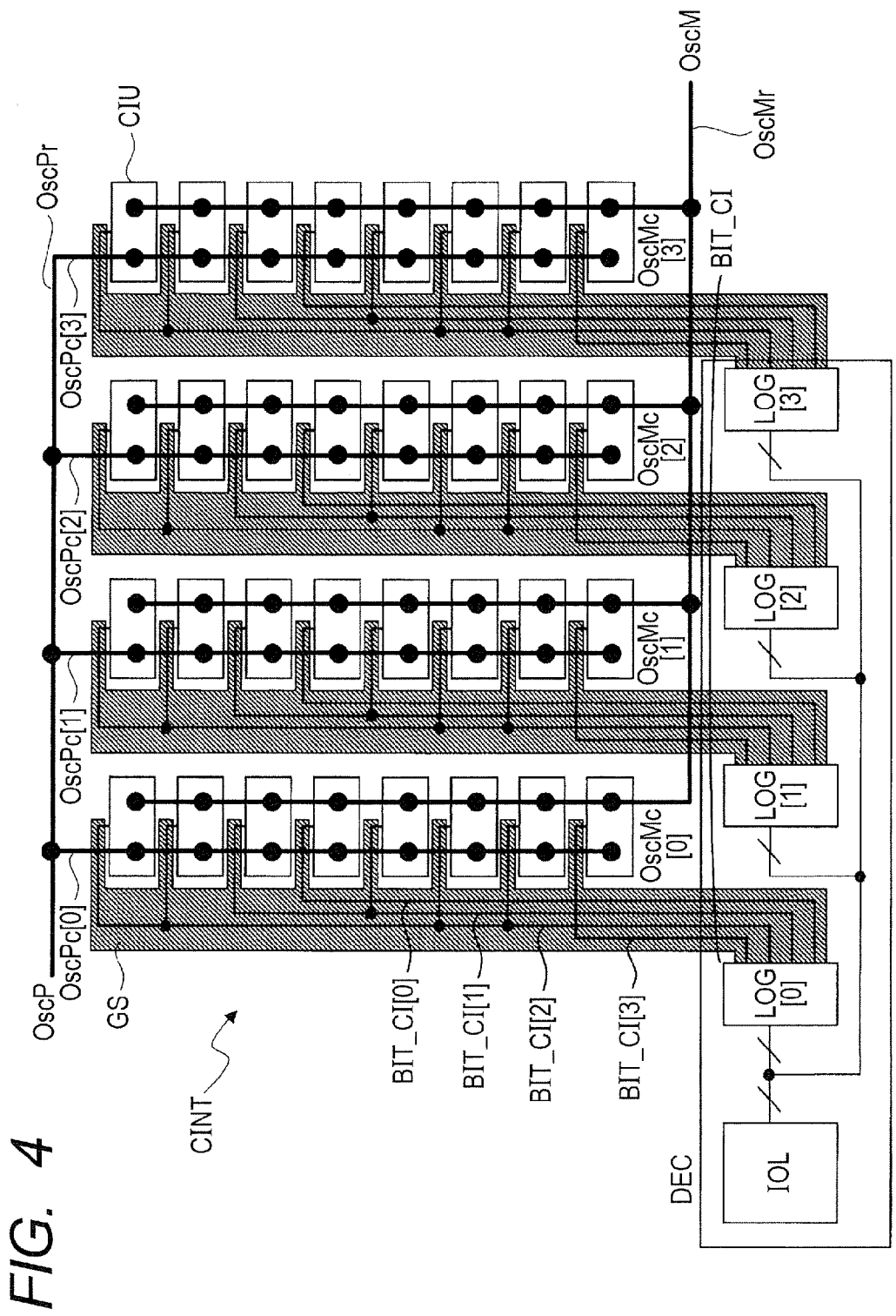
FIG. 4 is a typical diagram showing one example of a layout outline of a capacitor bank in the digitally controller oscillator circuit of FIG. 1.

FIG. 4 is a typical diagram showing one example of a layout outline of a capacitor bank in the digitally controlled oscillator circuit of FIG. 1. A layout outline of the capacitor bank CINT shown in FIG. 1 is shown in FIG. 4. Here, 32 unitary capacitor units CIUs are arranged in a simplified fashion in the form of a matrix with 8 rows and 4 columns. However, the capacitor bank CINT is actually provided with, for example, 2048 CIUs with a matrix of 32 rows and 64 columns. In FIG. 4, an oscillation output node OscP includes an oscillation output node (oscillation output wiring) OscPr that extends along a row direction, and four oscillation output nodes (oscillation output wirings) OscPc[0] through OscPc[3] that branch off from the oscillation output node OscPr at equal intervals and extend side by side along a column direction. Likewise, an oscillation output node OscM includes an oscillation output node (oscillation output wiring) OscMr that extends along the row direction, and four oscillation output nodes (oscillation output wirings) OscMc[0] through OscMc

[3] that branch off from the oscillation output node OscMr at equal intervals and extend side by side along the column direction.

The oscillation output nodes OscPc[0] and OscMc[0] are arranged close to each other. Subsequently, in like manner, the oscillation output nodes OscPc[3] and OscMc[3] are also arranged close to each other. The oscillation output nodes OscPr and OscMr are provided on both sides with the thirty-two unitary capacitor units CIUs interposed therebetween in the column direction. The eight unitary capacitor units CIUs corresponding to the first column are sequentially arranged over wiring paths of the oscillation output nodes OscPc[0] and OscMc[0]. The respective unitary capacitor units CIUs are coupled to the oscillation output nodes OscPc[0] and OscMc[0]. Subsequently, in like manner, the eight unitary capacitor units CIUs corresponding to the fourth column are sequentially arranged over wiring paths of the oscillation output nodes OscPc[3] and OscMc[3]. The respective unitary capacitor units CIUs are coupled to the oscillation output nodes OscPc[3] and OscMc{3}.

A plurality (four herein) of on/off control lines BIT_CI[0] through BIT_CI[3] that extend side by side along the column direction are arranged in the neighborhood of the eight unitary capacitor units CIUs corresponding to the first column. Likewise even with respect to the second, third and fourth columns, a plurality (four herein) of on/off control lines that extend side by side along the column direction are arranged every column in the neighborhood of the eight unitary capacitor units CIUs that configure the respective columns. The on/off control lines corresponding to the first column are driven by a logic circuit LOG[0]. Subsequently, in like manner, the on/off control lines corresponding to the second, third and fourth columns are respectively driven by logic circuits LOG[1], LOG[2] and LOG[3]. The logic circuits LOG[0] through LOG[3] configure a decoder circuit DEC along with a logic control circuit IOL. The decoder circuit DEC is disposed along any (one side on the OscMr side herein) of the sides of a matrix area of the unitary capacitor units CIUs.

Aiming at the eight unitary capacitor units CIUs included in the first column, the logic circuit LOG[0] controls one unitary capacitor unit CIU using the on/off control line BIT_CI[0], controls the two CIUs using the on/off control line BIT_CI[1], controls the four unitary capacitor units CIUs using the on/off control line BIT_CI[2], and controls one unitary capacitor unit CIU using the on/off control line BIT_CI[3]. Specifically, the logic circuit LOG[0] controls in common on/off of the switches (SWI1 through SWI3 of FIG. 2) included in the two unitary capacitor units CIUs using the on/off control line BIT_CI[1], for example. Accordingly, if, for example, only the on/off control line BIT_CI[0] is driven to an on level, one capacitive element (CIp, CIm of FIG. 2) is added to each of the oscillation output nodes OscPc[0] and OscMc[0]. If only the on/off control line BIT_CI[1] is driven to the on level, two capacitive elements are added to the oscillation output nodes OscPc[0] and OscMc[0] respectively. Further, if the on/off control lines BIT_CI[0] and BIT_CI[1] are driven to the on level, three capacitive elements are added to the oscillation output nodes OscPc[0] and OscMc[0] respectively. Subsequently, in like manner, four to eight capacitive elements can respectively be added to the oscillation output nodes OscPc[0] and OscMc[0] by suitably combining the on and off levels of the on/off control lines BIT_CI[0] through BIT_CI[3].

The logic circuits LOG[2] and LOG[3] are also similar to the above. For example, the logic circuit LOG[3] suitably combines the on and off levels of the on/off control lines BIT_CI[0] through BIT_CI[3] to thereby make it possible to suitably add 0 to eight capacitive elements to the oscillation output nodes OcsPc[3] and OscMc[3]. The logic control circuit IOL selects any of the logic circuits LOG[0] through LOG[3] to give instructions as to the on and off levels of the on/off control lines BIT_CI[0] through BIT_CI[3] and give a command for driving the entire on/off control lines BIT_CI[0] through BIT_CI[3] to the on or off level to the logic circuits LOG[0] through LOG[3]. Thus, for example, when the nine capacitive elements are added to the oscillation output nodes OscP and OscM, the logic circuit LOG[1] may be selected in a state in which the entire on/off control lines BIT_CI[0] through BIT_CI[3] have been driven to the on level at the logic circuit LOG[0], and only the on/off control line BIT_CI[0] may be driven at the logic circuit LOG[1].

The on/off control lines BIT_CI and the respective wirings for the oscillation output nodes OscP and OscM are made labyrinthine as is understood from FIG. 4. Therefore, the direct parasitic capacitances (CPp1 and CPm1 of FIG. 3) lying between each on/off control line BIT_CI and the oscillation output nodes OscP and OscM are changeable every control line (every logic circuit LOG and every BIT_CI[0] through BIT_CI[3] of on/off control lines lying in the logic circuits LOG) that configures the BIT_CI. Therefore, as shown in FIG. 4, the respective on/off control lines BIT_CI are protected by the shield sections GS. Specifically, as shown in FIG. 4, the on/off control lines BIT_CI[0] through BIT_CI[3] of the logic circuits LOG[0] through LOG[3] are protected by their corresponding shield sections GS different every logic circuit. Consequently, the magnitudes (or variations in magnitudes) of the direct parasitic capacitances (i.e., corresponding to the parasitic capacitances CPp1 and CPm1 of FIG. 3) lying between each on/off control line BIT_CI and the oscillation output nodes OscP and OscM can be reduced.

<<Details of Major Features and Advantageous Effects of First Embodiment>>

Figure 5:
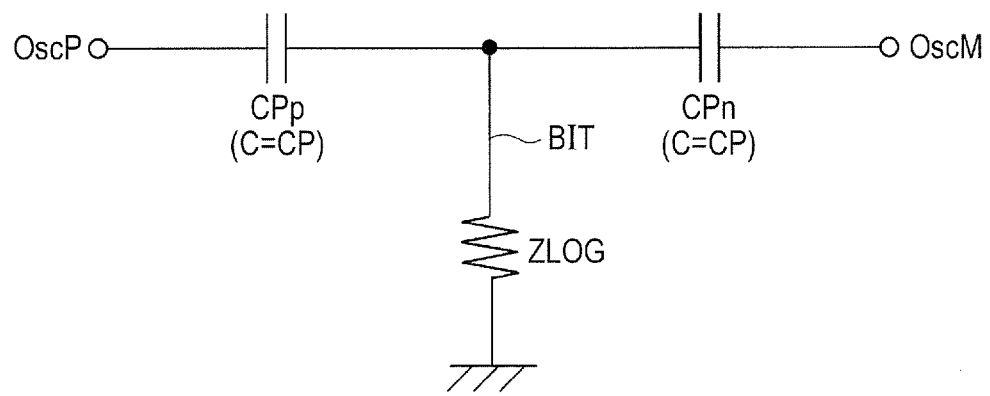
FIG. 5 is an explanatory diagram showing one example of a factor that degenerates DNL in a digitally controlled oscillator circuit discussed as the premise of the present invention.

FIG. 5 is an explanatory diagram showing one example of a factor that degenerates DNL of a digitally controlled oscillator circuit discussed as the premise of the present invention. If the layout relation between the on/off control lines BIT and the oscillation output nodes OscP and OscM is perfectly symmetric in FIG. 5, for example, the magnitudes of the parasitic capacitances CPp and CPm lying between the on/off control lines BITs and the oscillation output nodes OscP and OscM become equal (CPp=CPm=CP), thus raising the possibility of suppressing degeneration in DNL. More specifically, the degree that the parasitic capacitances CPp and CPm affect the oscillation output nodes OscP and OscM is actually changeable according to the voltage level (impedance ZLOG) of each on/off control line BIT. If the magnitudes of the parasitic capacitances CPp and CPm are however the same, their effects are uniformly added to the oscillation output nodes OscP and OscM, thus providing the possibility of sufficiently suppressing degeneration in DNL.

However, as shown in FIG. 4 in practice, the on/off control line BIT shown in FIG. 5 exist in plural form like the on/off control lines BIT_CI shown in FIG. 4. The on/off control lines BIT and the oscillation output nodes OscP and OscM take layouts labyrinthine in complexity within the capacitor block CINT (and CFRAC in FIG. 1). It is therefore not easy to symmetrically lay out all on/off control lines BIT and oscillation output nodes OscP and OscM. As a result, the parasitic capacitances CPp and CPm shown in FIG. 5 become inconsistent in magnitude. The degree of such inconsistency differs at random every on/off control line. Further, the oscillation output signals outputted to the oscillation output nodes OscP and OscM are not brought to perfect complementary signals according to the differential mismatch in the amplifier circuit block AMPBK of FIG. 1 and slight variations in amplitude and phase might occur. In doing so, a mismatch can occur between the magnitudes of the parasitic capacitances CPp and CPm equivalently.

Thus, when the magnitudes of parasitic capacitances CPp and CPm at a given on/off control line BIT and the magnitudes of parasitic capacitances CPp and CPm at another on/off control line BIT differ at random, there is a fear that the values of the parasitic capacitances that affect the oscillation output nodes OscP and OscM vary at random according to the driven states of the on/off control lines BIT, thus leading to degeneration in DNL. When the magnitude of the parasitic capacitance CPp and the magnitude of the parasitic capacitance CPm differ from each other at each BIT, the degree of degeneration in DNL may further be increased. Thus, it becomes beneficial that the on/off control lines BIT_CI and BIT_CF are protected by the shield sections GS as described above. In other words, it becomes beneficial that a shield layer is placed between each of the on/off control lines BIT_CI and BIT_CF and each of the oscillation output nodes OscP and OscM on the plane or cross section.

By providing such shield sections GS, the magnitudes of the direct parasitic capacitances (coupling connections) between the on/off control lines BIT_CI and BIT_CF and the oscillation output nodes OscP and OscM are reduced by a so-called shield effect. Concretely, the effects of the parasitic capacitances CPp1 and CPm1 in FIG. 3 are greatly reduced in terms of DNL. As a result, the amounts of variations in the parasitic capacitances corresponding to the driven states of the on/off control lines BIT_CI and BIT_CF are defined with being mainly aimed at the parasitic capacitances CPp2 and CPm2 in FIG. 3 at the oscillation output nodes OscP and OscM. The amounts of variations due to this become a regular, thus making it possible to realize a reduction in DNL (or INL).

Described specifically, the parasitic capacitances CPp2 and CPm2 in FIG. 3 affect the oscillation frequencies of the oscillation output nodes OscP and OscM through the capacitive elements CIp and CIm according to the driven states of the on/off control lines BIT as described above. The magnitudes of the parasitic capacitances CPp2 and CPm2 can however be set substantially uniform between the respective unitary capacitor units CIUs. Assume now that the oscillation frequencies of the oscillation output nodes OscP and OscM are sequentially changed while increasing one by one the selected number of unitary capacitor units CIU by the driving of the on/off control lines BIT_CI as described in FIG. 4, for example. In this case, since the magnitudes of the parasitic capacitances CPp2 and CPm2 are substantially uniform between the unitary capacitor units CIUs as described above although the effects of the parasitic capacitances CPp2 and CPm2 sequentially appear at the oscillation output nodes OscP and OscM, the degree of their effects becomes regular. Consequently, a reduction in DNL can be achieved.

Further, since it is easy to symmetrically lay out the parasitic capacitances CPp2 and CPm2 within the range of each CIU, the effects can uniformly be applied to the oscillation output nodes OscP and OscM according to the driven states of the on/off control lines BIT. As a result, a further reduction in DNL may be possible. According to another point of view, a restriction to such layout symmetry as described above is relaxed by the protection based on the shield sections GS. Consequently, a reduction in the circuit area and the like may be achieved along with an increase in the degree of freedom of the layout. Incidentally, in FIG. 1, a span for adjustment in the oscillation frequency is large with respect to the automatic band control signal W_ABS, and no particular problem arises in DNL. The protection by the shield sections is therefore not carried out in terms of the circuit area.

Further, as another feature, as described in FIG. 1, the shield sections GS are supplied with the same fixed voltage (e.g., ground power supply voltage GND2) V5 as the decoder circuit DEC. This is because if the fixed voltage V2 (ground power supply voltage GND1) for the amplifier circuits AMPP and AMPM is supplied to the shield sections GS, noise generated from the decoder circuit DEC is easy to be round intruded into the oscillation output nodes OscP and OscM via the fixed voltage V2. When noise is overlaid over the oscillation output nodes OscP and OscM, there is in danger of degenerating DNL in addition to an increase in phase noise or the like, etc. Thus, in FIG. 1, there are separately provided the power supplies (VDD1 and GND1 herein) for an actual oscillation section (LC section and amplifier circuit block AMPBK) and the power supplies (VDD2 and GND2 herein) for the logic section (decoder circuit DEC). The power supply (GND2 herein) for the logic section is supplied to the shield sections GS. Incidentally, although the power supply GND2 is supplied to the shield sections GS herein, an AC ground power supply voltage may be used, and the power supply VDD2 may be supplied as the case may be.

<Detailed Configuration of Periphery of Unitary Capacitor Unit>>

Figure 6:
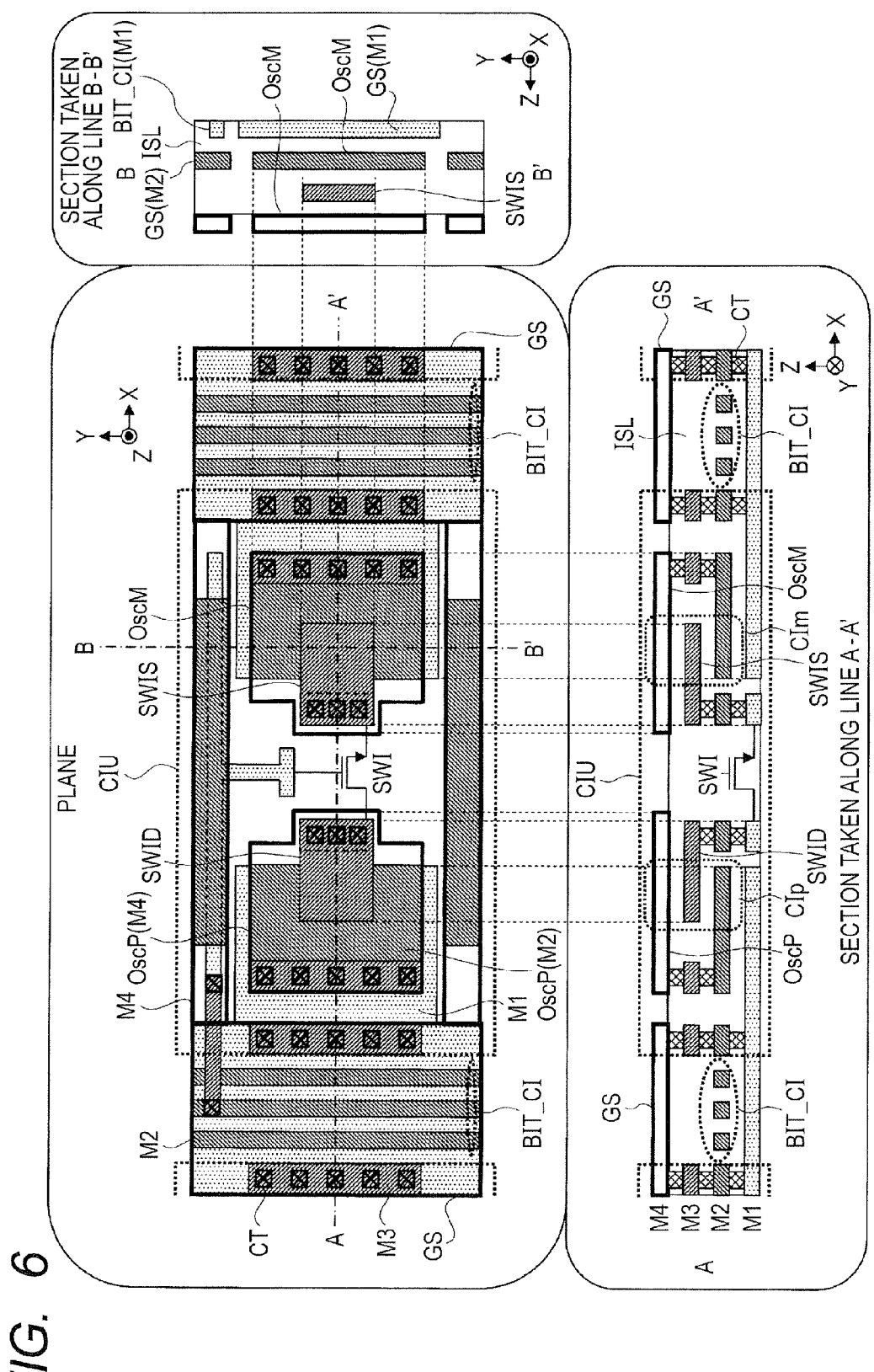
FIG. 6 is a plan view and a sectional view showing in the layout outline of FIG. 4, a detailed layout configuration example of the periphery of each unitary capacitor unit therein and a device sectional structure example thereof.

FIG. 6 is a plan view and a sectional view showing in the layout outline of FIG. 4, a detailed layout configuration example of the periphery of each unitary capacitor unit therein and a device sectional structure example thereof. In FIG. 6, respective reference numerals in the unitary capacitor unit CIU respectively correspond to the above-described reference numerals shown in FIG. 2. As to respective reference numerals not shown in FIG. 2, M1, M2, M3 and M4 respectively indicate first, second, third and fourth metal wiring layers, CT indicate contact layers that appropriately couple between the metal wiring layers, and ISL indicates an insulating film that covers the metal wiring layers. Although the portions of the metal wiring layers are shown in extracted form in the sectional views (corresponding to the section taken along line A-A' and the section taken along line B-B') shown in FIG. 6, a semiconductor substrate actually exists in its lower layer (Z-axis direction).

In the plan view of FIG. 6, a plurality (three simply displayed herein) of on/off control lines BIT_CI that extend side by side along a Y-axis direction (column direction) are disposed on both sides that interpose a single unitary capacitor unit CIU therebetween in an X-axis direction (row direction). The on/off control lines BIT_CI control the unitary capacitor unit CIU disposed adjacent to one side (right side herein) as viewed in the X-side direction. In the unitary capacitor unit CIU, as shown in the sectional view taken along line A-A', a capacitive element CIp is formed on one side and a capacitive element CIm is formed on the other side with a switch SWI (whose detailed structure example is omitted herein) interposed therebetween as viewed in the X-axis direction. The capacitive element CIp is provided with a node SWID formed by the third metal wiring layer M3. The node SWID is coupled to one end (concretely unillustrated drain diffusion layer in the semiconductor substrate) of the switch SWI through the contact layers CT and the first and second metal wiring layers M1 and M2.

The layer (M4) above the node SWID and the layer (M2) therebelow as viewed in a Z-axis direction are respectively formed with oscillation output nodes OscP through the insulating film ISL. The oscillation output nodes OscP for the upper and lower layers M4 and M2 are coupled via the contact layers CT and the third metal wiring layer M3. Thus, as shown in the plan view of FIG. 6, a part of the capacitive element CIp is formed by a portion at which the node SWID and the oscillation output node OscP (M4) overlap, whereas another part thereof is formed by a portion at which the node SWID and the oscillation output node OscP (M2) overlap. That is, the capacitive element CIp is configured by parallel coupling of two capacitive elements. Of course, the oscillation output node OscP can however also be formed of only either one of the metal wiring layers M4 and M2. Such a capacitive element CIp may be called an MOM capacitor in a sense that a portion of an insulating film (I) at an MIM capacitor is formed using an interlayer insulating film (typically silicon oxide film) of a normal metal wiring layer. Since the MOM capacitor is formed in a wiring process, variations in a chip can be suppressed as compared with the MIM and MOS capacitors. The MOM capacitor therefore brings about an advantage that DNL caused by relative variations in elements can be reduced.

In the plan view of FIG. 6 and the sectional view taken along line A-A' in FIG. 6, the three on/off control lines BIT_CI each formed by the second metal wiring layer M2 are arranged in a place (left side herein) adjacent to the unitary capacitor unit CIU as viewed in the X-axis direction. Here, the on/off control lines BIT_CI have peripheries covered with the above shield sections GS as is understood from the sectional view taken along line A-A'. That is, with the on/off control lines BIT_CI as the reference, the lower and upper layers as viewed in the Z-axis direction are covered with wirings (GS) for the first and fourth metal wiring layers M1 and M4, and the right and left as viewed in the X-axis direction are covered with the contact layers CT that couple between the second and fourth metal wiring layers M1 and M4, and wirings (GS) for the second and third layers M2 and M3. As shown in the plan view of FIG. 6, the wirings for the second and third metal wiring layers M2 and M3 respectively have some degree of length as viewed in the Y-axis direction. The length is equivalent to the length of each of the oscillation output nodes OscP (M4) and OscP (M2) as viewed in the Y-axis direction. Thus, the shield is made between the on/off control lines BIT_CI and the oscillation output nodes OscP disposed outside the unitary capacitor unit CIU.

As shown in the plan view of FIG. 6, any one (located in the middle herein) of the three on/off control lines BIT_CI is coupled to its corresponding wiring for the third metal wiring layer M3 by the contact layers CT. The wiring for the third metal wiring layer M3 extends toward the unitary capacitor unit CIU adjacent thereto in the X-axis direction. The wiring for the third metal wiring layer M3 is coupled to the wiring for the first metal wiring layer M1 through the contact layers CT and the second layer M2. The wiring for the first metal wiring layer M1 extends along the X-axis direction and is thereafter coupled to a gate of the switch SWI (NMOS transistor). Here, as understood from the sectional view taken along line B-B' and the plan view, the wiring (i.e., BIT_CI) for the first metal wiring layer M1 is protected by its corresponding shield section GS (M1) comprised of the first metal wiring layer M1 as viewed in the Y-axis direction and protected by its corresponding shield section GS (M2) comprised of the second metal wiring layer M2 as viewed in the Z-axis direction. Thus, as understood from the sectional view taken along line B-B' and the plan view, the shield is made between the on/off control lines BIT_CI and the oscillation output nodes OscP and OscM arranged within the unitary capacitor unit CIU.

Here, the configuration around the unitary capacitor unit CIU shown in FIG. 6 has a feature in that the wiring for the first metal wiring layer M1 is provided in a wide area at the layer below the on/off control lines BIT_CI and the oscillation output nodes (M2) lying outside the unitary capacitor unit CIU as understood from the plan view and the sectional view taken along line A-A', in addition to the feature that the on/off control lines BIT_CI are shielded inside and outside the unitary capacitor unit CIU as described above. Although the wiring for the first metal wiring layer M1 serves as the shield section GS, it is also equipped with the function of shielding against noise from the unillustrated semiconductor substrate. Consequently, an improvement in the quality of the oscillation output signal can be realized, thus resulting in the contribution, even to an improvement in DNL.

Incidentally, as to the structure of the capacitive element CIm shown in the sectional view taken along line A-A' and the plan view in FIG. 6, it takes such a structure that the above structure of capacitive element CIp is folded back symmetrically about the Y-axis, and its detailed description will therefore be omitted. Although the upper layer of each on/off control line BIT_CI lying outside the unitary capacitor unit CIU has been shielded by the wiring for the fourth metal wiring layer M4 In FIG. 6, it can also be shielded by the wiring for the third metal wiring layer M3 instead of it. Further, although the configuration of the periphery of the single CIU has been shown herein, there is actually provided such a configuration that as shown in FIG. 4, the unitary capacitor unit CIU of FIG. 6 is disposed in plural numbers (eight in the example of FIG. 4) in the Y-axis direction, and the oscillation output nodes OscP and OscM lying within the respective unitary capacitor units CIUs are respectively coupled to each other by the common wirings (e.g., the oscillation output nodes OscPc[0], OscMc[0] and so on in FIG. 4). In this case, the common wirings are formed by, for example, a fifth metal wiring layer (not shown) located in a layer above the fourth metal wiring layer M4 in FIG. 6.

<<Schematic Configuration of Digitally PLL Circuit>>

Figure 7:
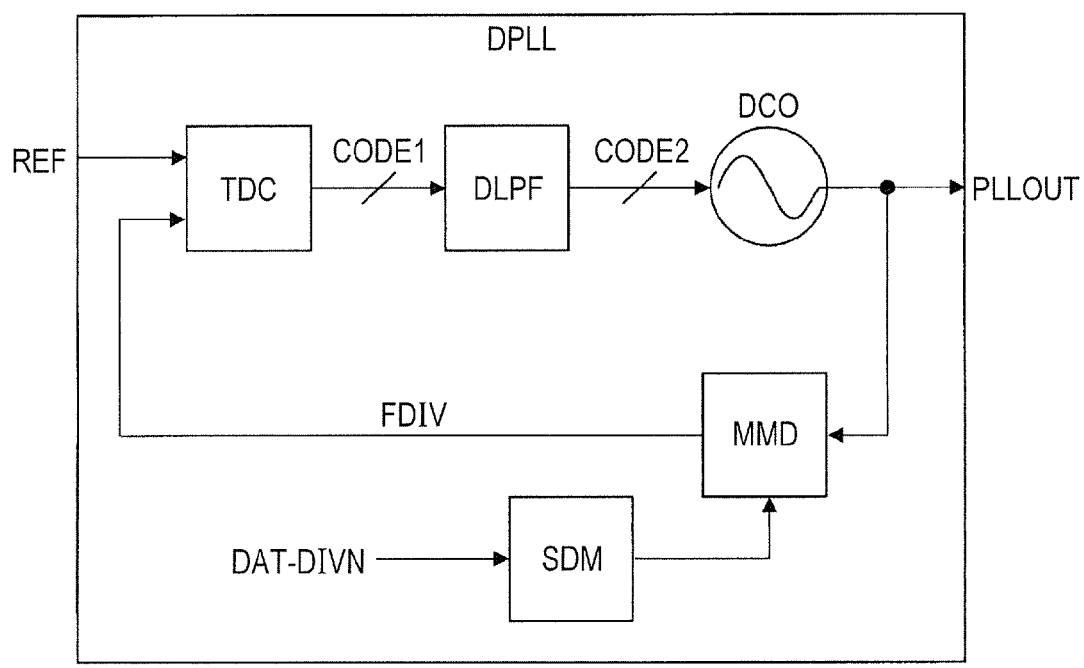
FIG. 7 is a block diagram showing a schematic configuration example of a digitally PLL circuit to which the digitally controlled oscillator circuit shown in FIG. 1 is applied, in the digitally controlled oscillator device according to the first embodiment of the present invention.

FIG. 7 is a block diagram showing a schematic configuration example of a digitally PLL circuit to which the digitally controlled oscillator circuit shown in FIG. 1 is applied, in the digitally controlled oscillator device according to the first embodiment of the present invention. The digitally PLL circuit (digitally controlled oscillator device) DPLL shown in FIG. 7 is equipped with a time difference detector (digital phase comparator) TDC, a digital low-pass filter (digital loop filter) DLPF, a digitally controlled oscillator circuit DCO, a multi modulus frequency divider (division section) MMD, and a sigma delta modulator (or delta sigma modulator) SDM. The configuration example of FIG. 1 is applied to the digitally controlled oscillator circuit DCO.

The time difference detector TDC detects a difference in phase (time) between a reference oscillation signal REF having a reference oscillation frequency (e.g., 26 MHz) generated by a crystal oscillator or the like, and a division oscillation signal FDIV generated by the multi modulus frequency divider (division section) MMD. The time difference detector TDC includes, for example, a plurality of stages of unit delay circuits (CMOS inverter circuits). The time difference detector TDC sequentially delays the division oscillation signal FDIV by means of the unit delay circuits, latches outputs of the unit delay circuits in sync with the reference oscillation signal REF, and detects a phase difference (time difference) according to the result of the latch. The smaller the amount of delay in each unit delay circuit with miniaturization through a CMOS manufacturing process, the more the detected result of phase difference (time difference) can be improved in accuracy.

The digital low-pass filter DLPF performs an averaging process with a digital code CODE1 indicative of the result of phase comparison from the time difference detector TDC as a target. As the digital low-pass filter DLPF, may be mentioned, typically, an IIR (Infinite Impulse Response) filter, an FIR (Finite Impulse Response) filter, a combination of these or the like. IN response to a digital code CODE2 indicative of the result of processing by the digital low-pass filter DLPF, the digitally controlled oscillator circuit DCO generates an oscillation output signal PLLOUT having an oscillation frequency corresponding to the value of the CODE2. The digital code CODE2 corresponds to the integer capacitance value control signal W_INT or the fraction capacitance value control signal W_FRAC in FIG. 1. Incidentally, although not shown in the drawing, a frequency difference detector or the like provided with a counter circuit or the like is actually provided along with the time difference detector TDC. The automatic band control signal W_ABS shown in FIG. 1 is generated by the frequency difference detector or the like.

The sigma delta modulator SDM sets a division ratio to the multi modulus frequency divider MMD based on a division ratio set code DAT-DIVN and variably controls the division ratio. For example, the division ratio set code DAT-DIVN indicates a division ratio including a decimal fraction. The sigma delta modulator SDM sets integer division ratios different on a time sequence basis to the multi modulus frequency divider MMD to thereby set a division ratio including a decimal point on average. The multi modulus frequency divider MMD divides the oscillation output signal PLLOUT with the division ratio set by the sigma delta modulator SDM and feeds back the result of division to the time difference detector TDC as the division oscillation signal FDIV. Applying the digitally controlled oscillator circuit DCO according to the first embodiment to such a DPLL makes it possible to realize a high-precision digitally controlled oscillator device small in phase error or the like. Since a higher-precision frequency setting has been required for a PLL circuit capable of setting a division ratio including a decimal point in particular, it is more profitable to achieve a reduction in DNL by the system of the first embodiment.

By using the digitally controlled oscillator device according to the first embodiment as described above, the reduction in DNL (or INL) can typically be realized. It is also possible to reduce DNL (or INL) without performing a calibration operation required where the above dynamic element matching system or the like is used.

Incidentally, although the shield layers (shield sections) are provided so as to cover all of the peripheries (top and bottom and right and left) of the on/off control lines BIT_CI in FIG. 6, for example, in the present embodiment, the shield layers may be provided between the on/off control lines and the oscillation output nodes in principle, and are not necessarily required to cover all thereof. In other words, the shield layer may be provided in such a manner that the on/off control line and the oscillation output node are effectively shielded. It is however realistically considered that the oscillation output nodes are often laid out so as to exist on the right and left of the on/off control lines BIT_CI and at their upper portions as shown in FIG. 4. It is desirable to suppress noise from the semiconductor substrate as described above even at their lower portions. It is thus desirable that at least some of the shield sections is actually configured so as to surround all of the peripheries of the on/off control lines BIT_CI as viewed in the sectional structure.

Second Embodiment

Layout Outline of Capacitor Bank [2]

Figure 8:
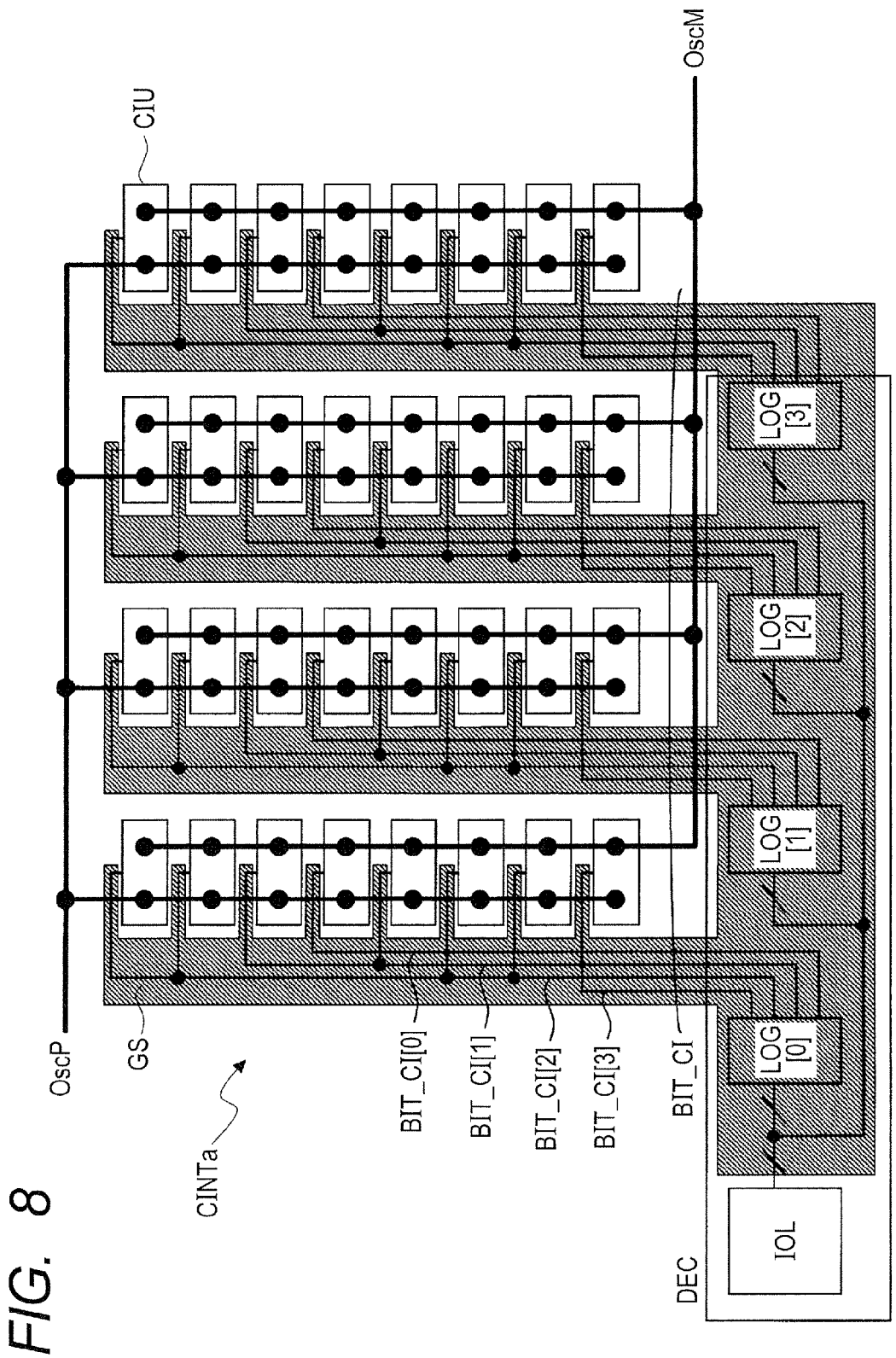
FIG. 8 is a typical diagram showing one example of a layout outline of a capacitor bank lying within a digitally controlled oscillator circuit included in a digitally controlled oscillator device according to a second embodiment of the present invention.

FIG. 8 is a typical diagram showing one example of a layout outline of a capacitor bank lying within a digitally controlled oscillator circuit included in a digitally controlled oscillator device according to a second embodiment of the present invention. A capacitor bank CINTa shown in FIG. 8 is a modification of the above capacitor bank CINT of FIG. 4. The capacitor bank CINTa is different therefrom in that as compared with the capacitor bank CINT of FIG. 4, logic circuits LOG[0] through LOG[3] in a decoder circuit DEC are protected by a shield section GS in addition to on/off control lines BIT_CI. Since the present capacitor bank is similar to that shown in FIG. 4 in configuration other than it, its detailed description will be omitted.

The logic circuits LOG[0] through LOG[3] may be disposed in the neighborhood of oscillation output nodes OscP and OscM. Since the LOG[0] through LOG[3] are the sources of occurrence of the on/off control lines BIT_CI in such a case, DNL is in danger of being degenerated due to the same reason as the on/off control lines BIT_CI with direct parasitic capacitances (coupling connection) between the logic circuits LOG[0] through LOG[3] and the oscillation output nodes OscP and OscM. A further improvement in DNL can be achieved as compared with the case of FIG. 4 by protecting the logic circuits LOG[0] through LOG[3] by the shield section GS as shown in FIG. 8.

<<Schematic Layout Configuration of Digitally Controlled Oscillator Circuit>>

Figure 9:
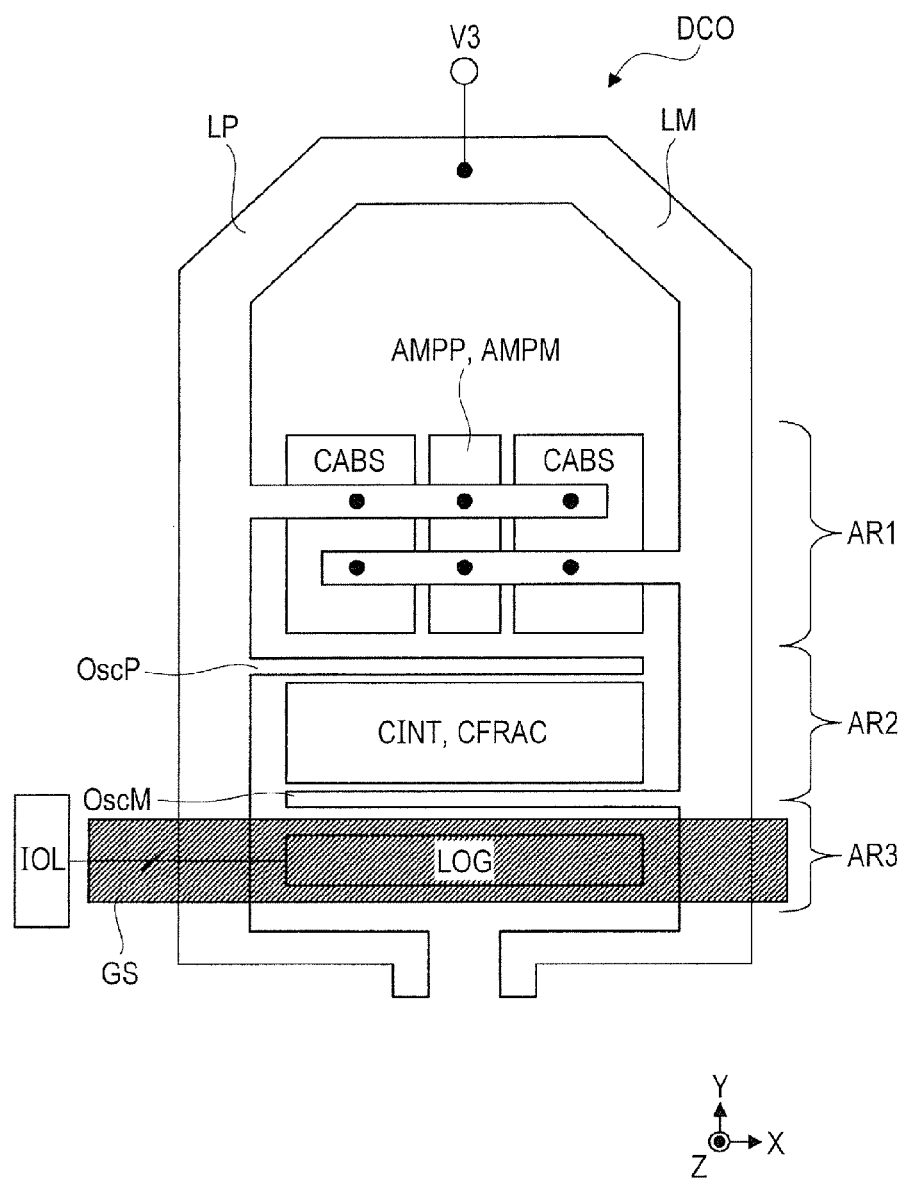
FIG. 9 is a plan view showing a schematic layout configuration example of the digitally controlled oscillator circuit included in the digitally controlled oscillator device according to the second embodiment of the present invention.

FIG. 9 is a plan view showing a schematic layout configuration example of the digitally controlled oscillator circuit included in the digitally controlled oscillator device according to the second embodiment of the present invention. Respective reference numerals shown in FIG. 9 respectively correspond to those shown in FIG. 1. The digitally controlled oscillator circuit DCO shown in FIG. 9 is shaped substantially in the form of a ring and provided with a metal wiring (LP, LM) disposed symmetrically about a Y axis. In the metal wiring, a fixed voltage (AC ground power supply voltage) V3 is applied to its middle point (center tap). With the center tap as the reference, a coil element LP is realized on one side, and a coil element LM is realized on the other side. A first area AR1, a second area AR2 and a third area AR3 are provided in order inside the ring in the Y-axis direction.

Capacitor banks CINT and CFRAC are disposed in the second area AR2, and a logic circuit LOG is disposed in the third area AR3. In the present example, the capacitor banks CINT and CFRAC are respectively comprised of a plurality of unitary capacitor units CIUs each having the same layout. The capacitor bank CINT is configured by a part of the unitary capacitor units CIUs, whereas the capacitor bank CFRAC is configured by another part thereof. In the Y-axis direction, a wiring that branches off from the coil element LP and extends along the X-axis direction is disposed at one of both sides of the capacitor banks CINT and CFRAC. A wiring that branches off from the coil element LM and extends along the X-axis direction is disposed at the other of both sides. The former wiring serves as an oscillation output node OscP, and the latter wiring serves as an oscillation output node OscM.

Figure 10:
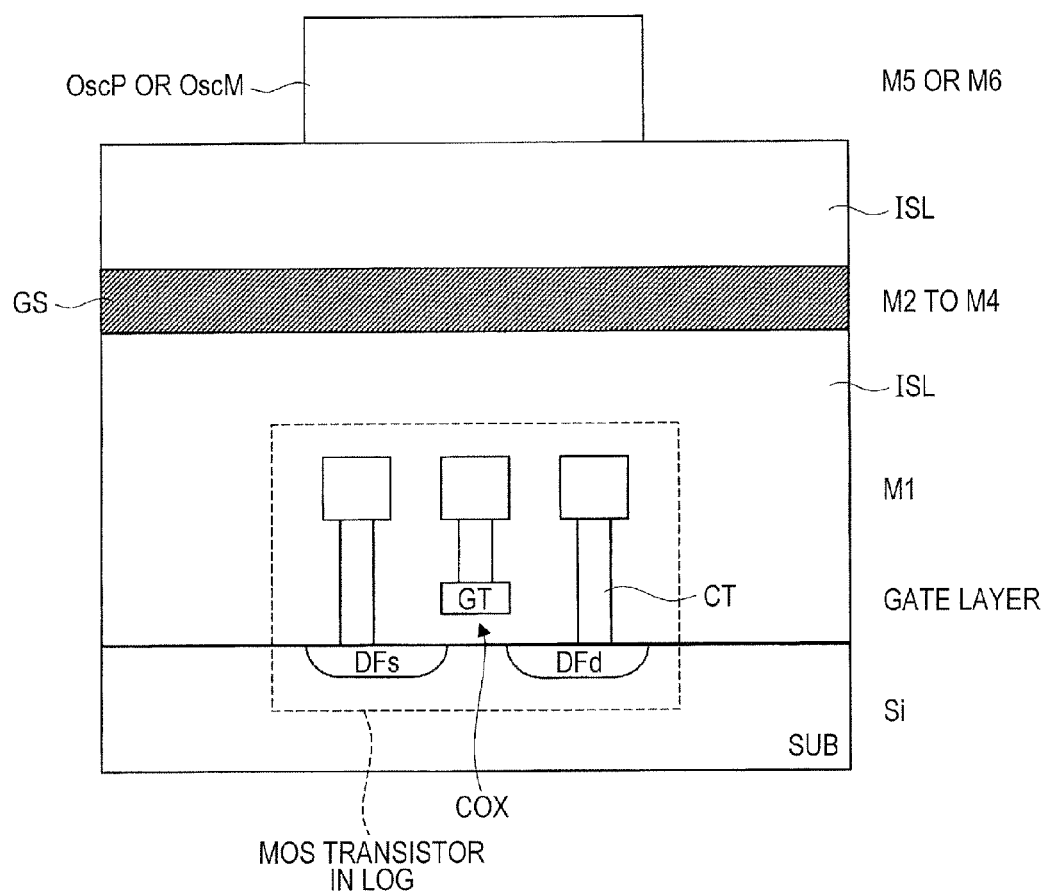
FIG. 10 is an explanatory diagram showing an example illustrative of the relationship of wiring layers for a logic circuit and an oscillation output node in FIGS. 8 and 9.

Here, FIG. 8 described above shows a detailed layout configuration example of the peripheries of the capacitor banks CINT and CFRAC in FIG. 9. As shown in FIGS. 8 and 9, the logic circuit LOG controls the respective unitary capacitor units in the capacitor banks CINT and CFRAC under the control from a logic control circuit IOL disposed outside the ring (LP, LM). The logic circuit LOG is protected by the shield section GS. Although its details are shown in FIG. 10, the shield section GS is disposed in, for example, a layer (Z-axis direction) above the logic circuit LOG in FIG. 9.

Further, the coil elements LP and LM (OscP and OscM) are disposed in a layer thereabove with the shield section GS interposed therebetween.

In the first area AR1, capacitor banks CABS are disposed in divided form on both sides with amplifier circuits AMPP and AMPM interposed therebetween as viewed in the X-axis direction. A wiring (i.e., OscP) that branches off from the coil element LP and extends along the X-axis direction, and a wiring (i.e., OscM) that branches off from the coil element LM and extends along the X-axis direction are disposed in a layer above the amplifier circuits AMPP and AMPM and the capacitor banks CABS in the Z-axis direction. The amplifier circuits AMPP and AMPM and the capacitor banks CABS are appropriately coupled to the wirings OscP and OscM. Here, the first area AR1 is arranged substantially in the middle portion of the ring (LP, LM) as viewed in the Y-axis direction. With this arrangement, the amplifier circuits AMPP and AMPM are arranged substantially in the center portion of the ring. With the arrangement of such amplifier circuits AMPP and AMPM, the resonant frequency in an LC circuit can be set as single, and an increase in the accuracy of an oscillation frequency, an improvement in the quality of an oscillation output signal, and the like can be achieved.

That is, assume where, for example, the amplifier circuits AMPP and AMPM are disposed at the ends (e.g., areas or the like that interpose the third area AR3 therebetween and are opposite to the second area AR2 in FIG. 9). In this case, the capacitor bank CABS has the largest capacity where the LC circuit side is seen from the amplifier circuits AMPP and AMPM. Therefore, a first LC circuit associated with the capacitor banks CABS, CINT and CFRAC and other portions of the coil elements LP and LM can be seen via some (wirings from the amplifier circuits AMPP and AMPM to the capacitor bank CABS) of the coil elements LP and LM. Therefore, a second series LC circuit associated with the above-described some and the capacitor banks CABS, CINT and CFRAC can be seen from the amplifier circuits AMPP and AMPM, thus resulting in the occurrence of an unnecessary resonant frequency. No problem arises where the unnecessary resonant frequency is sufficiently larger than the required resonant frequency, but the unnecessary frequency becomes low as the distance between each of the amplifier circuits AMPP and AMPM and the capacitor bank CABS becomes long. It is thus necessary to bring the amplifier circuits AMPP and AMPM and the capacitor banks CABS as close to each other as possible. Since the amplifier circuits AMPP and AMPM are disposed substantially in the center portion of the ring (LP, LM) when such a layout configuration example as shown in FIG. 9 is used, the effect of such a difference in the perspective can be relaxed.

<<Relationship of Wiring Layers Around Logic Circuit>>

FIG. 10 is an explanatory diagram showing an example illustrative of the relationship of wiring layers between the logic circuit and the oscillation output node in FIGS. 8 and 9. In the examples of FIGS. 8 and 9, for example, the logic circuit LOG is disposed close to the oscillation output node OscM in particular and besides disposed close even to the coil elements LP and LM (substantially oscillation output nodes OscP and OscM). Thus, as described in FIG. 8, the parasitic capacitances between the logic circuit LOG and the oscillation output nodes OscP and OscM are in danger of becoming a problem. It becomes therefore profitable to provide a shield section (shield layer) GS in wiring layers located between the logic circuit LOG and the oscillation output nodes OscP and OscM as shown in FIG. 10.

FIG. 10 typically shows the upper and lower relations of the wiring layers in section. The figure does not necessarily show the existence of the oscillation output nodes OscP and OscM directly above the logic circuit LOG (surface formed by cutting the logic circuit LOG along the X-axis or Y-axis line), but shows that the oscillation output nodes OscP and OscM exist in the neighborhood of the cut surface. In FIG. 10, diffusion layers DFs and DFd that serve as a source and drain of a MOS transistor are formed in a semiconductor substrate (e.g., silicon substrate) SUB. The diffusion layers DFs and DFd are respectively coupled to wirings for a first metal wiring layer M1 via contact layers CT. A gate layer (e.g., polysilicon layer) GT that serves as a gate of the MOS transistor is disposed over the semiconductor substrate SUB through a gate insulating film COX. The gate layer GT is also coupled to the corresponding wiring for the first metal wiring layer M1 via the contact layer CT.

The logic circuit LOG is provided with a plurality of such MOS transistors. The respective MOS transistors are appropriately coupled using the first metal wiring layer M1 or wiring layers above a second metal wiring layer M2 corresponding to a layer thereabove. Since the logic circuit is not a so-complicated circuit in practice, it is formed by a wiring layer below a third metal wiring layer M3 that serves as a layer above the second metal wiring layer M2. In this case, the shield section (shield layer) GS is formed by, for example, a fourth metal wiring layer M4 that serves as a layer above the third metal wiring layer M3. The shield section GS is actually disposed directly above the logic circuit LOG. Incidentally, the shield section GS can of course also be formed by using, for example, wirings for the second and third metal wiring layers M2 and M3 other than the fourth metal wiring layer M4, depending on the configuration of the logic circuit LOG.

The oscillation output node OscP (or OscM) is formed using a fifth metal wiring layer M5 or a sixth metal wiring layer M6 that serves as a layer above the fourth metal wiring layer M4. The coil elements (LP and LM in FIG. 9) formed over a semiconductor chip are normally often formed by a metal wiring layer corresponding to the top layer. Respective wirings for the oscillation output nodes OscP and OscM are often formed using the same layer as the coil elements or a lower layer adjacent thereto in the form of branching off from the coil elements LP and LM. On the other hand, each logic circuit LOG is sequentially formed toward the upper layer from the semiconductor substrate SUB, each of the metal wiring layers can normally be ensured between the top layer for the logic circuit LOG and the bottom layer for the oscillation output nodes OscP and OscM. Therefore, the shield section (shield layer) GS is formed using the metal wiring layer (M4 in the present example) to thereby make it possible to reduce a direct parasitic capacitance (coupling connection) between the logic circuit LOG and each of the oscillation output nodes OscP and OscM.

A further reduction in DNL (or INL) may typically be achieved as compared with the first embodiment by using the digitally controlled oscillator device according to the second embodiment as described above.

Third Embodiment

Layout Outline of Capacitor Bank [3]

Figure 11:
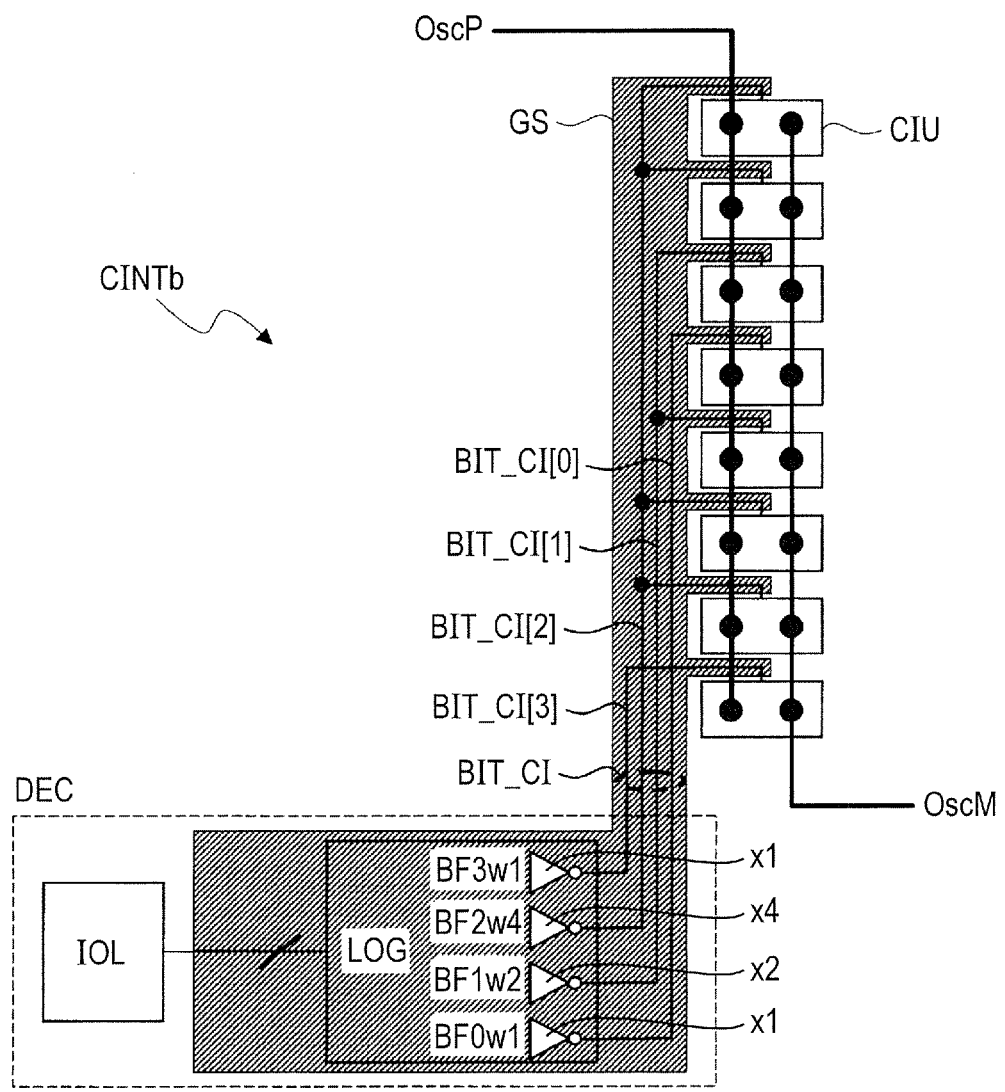
FIG. 11 is a typical diagram illustrating one example of a layout outline of a capacitor bank in a digitally controlled oscillator circuit included in a digitally controlled oscillator device according to a third embodiment of the present invention.

FIG. 11 is a typical diagram illustrating one example of a layout outline of a capacitor bank in a digitally controlled oscillator circuit included in a digitally controlled oscillator device according to a third embodiment of the present invention. A capacitor bank CINTb shown in FIG. 11 is a modification of the capacitor bank CINTa of FIG. 8 described above. For convenience of explanation, one column section (eight CIUs herein) of the unitary capacitor units CIU in the capacitor bank CINTa shown in FIG. 8 is typically extracted. Here, the capacitor bank CINTb of FIG. 11 is different as compared with the capacitor bank CINTa of FIG. 8 in that buffer circuits BF0w1, BF1w2, BF2w4 and BF4w1 lying within a logic circuit LOG, which drive on/off control lines BIT_CI[0] through BIT_CI[3] are shown. A feature is shown in that weights are assigned to drive capacities of the buffer circuits. Since the present example is similar to the case of FIG. 8 in configuration other than it, its detailed description will be omitted.

The buffer circuit BF0w1 drives the on/off control line BIT_CI[0] which controls one unitary capacitor unit CIU. The buffer circuit BF1w2 drives the on/off control line BIT_CI[1] which controls the two unitary capacitor units CIUs, and has a drive capacity equivalent to twice that of the buffer circuit BF0w1. The buffer circuit BF2w4 drives the on/off control line BIT_CI[2] which controls the four unitary capacitor units CIUs, and has a drive capacity equivalent to four times that of the buffer circuit BF0w1. The buffer circuit BF3w1 drives the on/off control line BIT_CI[3] which controls one unitary capacitor unit CIU, and has a drive capacity equivalent to that of the buffer circuit BF0w1. Although each buffer circuit is not limited in particular, it is typically comprised of a CMOS inverter circuit. In this case, the sizes (e.g., gate widths) of a PMOS transistor and an NMOS transistor that configure each CMOS inverter circuit differ according to the above weighting.

Figure 12:
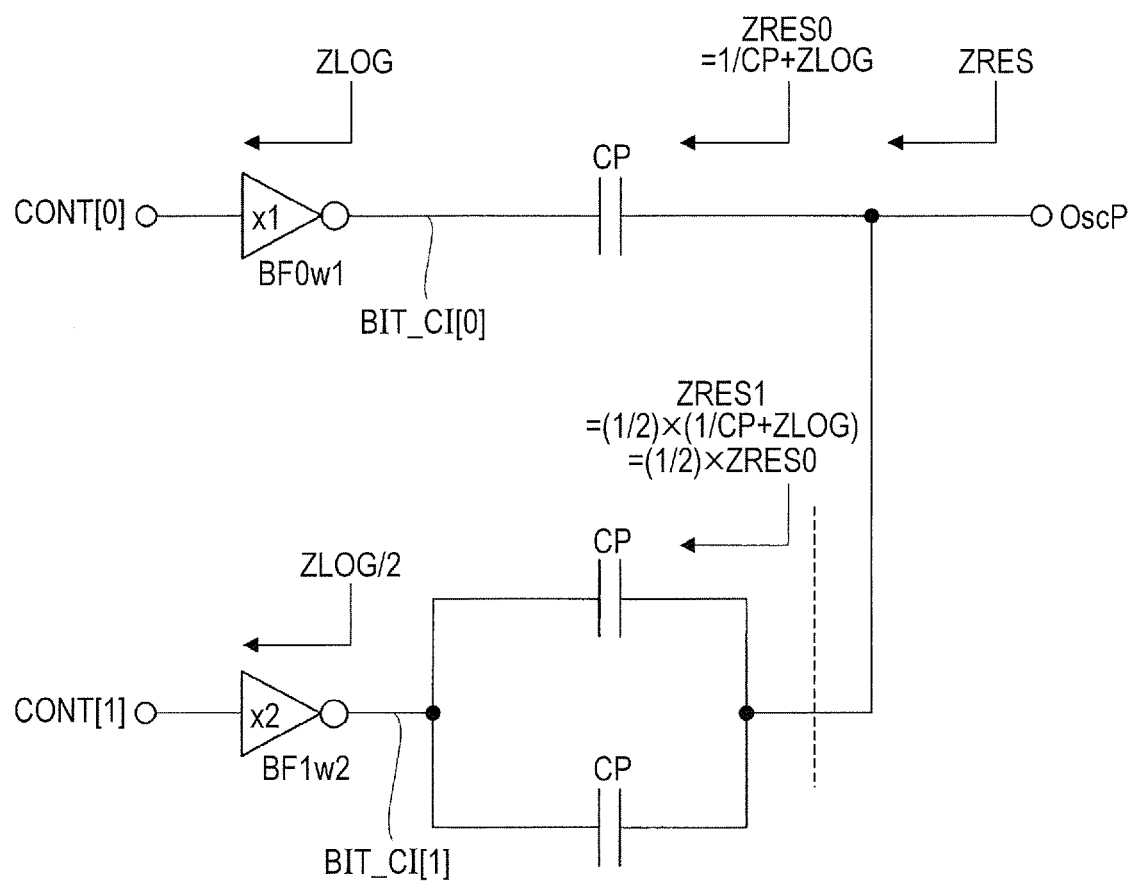
FIG. 12 is a principle diagram showing one example of an advantageous effect obtained when the layout outline of FIG. 11 is used.
Figure 13:
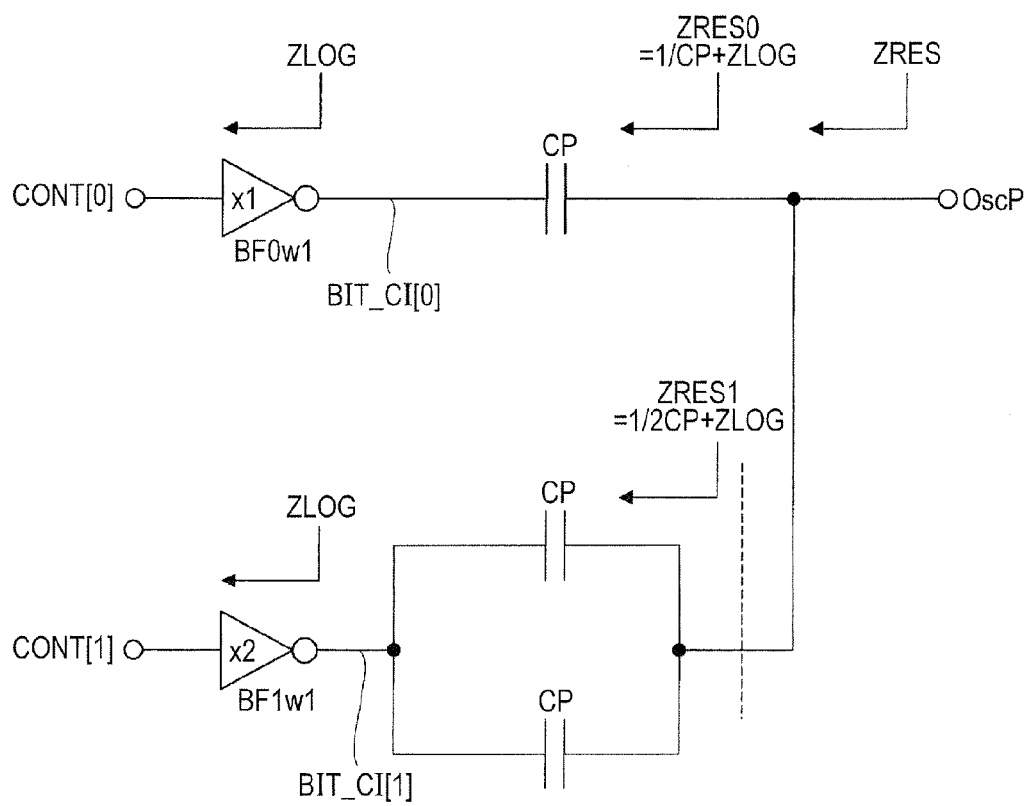
FIG. 13 is a diagram depicting a comparative example of FIG. 12.

FIG. 12 is a principle diagram showing one example of an advantageous effect obtained when the layout outline of FIG. 11 is used. FIG. 13 is a diagram showing a comparative example of FIG. 12. A relationship between the buffer circuits BF0w1 and BF1w2, the on/off control lines BIT_CI[0] and BIT_CI[1] and the oscillation output node OscP is shown in FIG. 12 in the form of an equivalent circuit. A parasitic capacitance CP exists between the on/off control line BIT_CI[0] and the oscillation output node OscP. Two parasitic capacitances CPs coupled in parallel exist between the on/off control line BIT_CI[1] and the oscillation output node OscP. Here, as described in the first embodiment, each parasitic capacitance CP in FIG. 12 substantially corresponds to an effective component through the capacitive element CIp based on the parasitic capacitance CPp2 as a result of shielding of the parasitic capacitance CPp1 in FIG. 3. Since the magnitude of each parasitic capacitance CP becomes approximately uniform every unitary capacitor unit CIU as described above, one parasitic capacitance CP is coupled to the on/off control line BIT_CI[0] coupled to one unitary capacitor unit CIU, and the two parasitic capacitances CPs are coupled in parallel to the on/off control line BIT_CI[1] coupled to two unitary capacitor units CIUs.

Here, more specifically, the degree that the corresponding parasitic capacitance CP affects the oscillation output node OscP differs depending on the levels (driven states of the buffer circuits BF0w1 and BF1w2) of the on/off control lines BIT_CI[0] and BIT_CI[1] as described in FIG. 3 or the like. This means that the impedance of each buffer circuit can equivalently be assumed to be changed over according to the driven state. If the impedance of the buffer circuit BF0w1 is ZLOG, then the impedance of the buffer circuit BF1w2 becomes (ZLOG/2) because the drive capacity (transistor size) is twice that of the buffer circuit BF0w1. In this case, the impedance ZRES0 taken where the buffer circuit BF0w1 side is seen from the oscillation output node OscP is expressed in ZRES0=(1/CP)+ZLOG (where frequency dependence is omitted). The impedance ZRES1 taken where the buffer circuit BF1w2 side is seen from the oscillation output node OscP is expressed in ZRES1=(ZRES0/2).

Now consider the amount of change in the impedance at the oscillation output node OscP where the value of (CONT[1], CONT[0]) is serially changed assuming that a signal input to the buffer circuit BF0w1 is CONT[0] and a signal input to the buffer circuit BF0w2 is CONT[1]. First, when (CONT[1], CONT[0]) is changed from (0, 0) to (0, 1), a variation in the impedance of ZRES0 with the CONT[0] occurs. Here, in order to provide easy understanding, the variation in impedance is converted into a variation in capacity, which in turn is assumed to be ΔC. Next, when (CONT[1], CONT[0]) is changed from (0, 1) to (1, 0), an impedance variation of −ZRES0 (i.e., −ΔC) with CONT[0] and an impedance variation of ZRES1 (=ZRES0/2) with CONT[1] occur. The impedance variation of (ZRES0/2) is given as 2ΔC in capacity terms. Accordingly, the capacity variation of ΔC occurs due to (−ΔC+2ΔC) upon transition from (0, 1) to (1, 0). At last, when (CONT[1], CONT[0]) is changed from (1, 0) to (1, 1), an impedance variation of ZRES0 (i.e., ΔC) with CONT[0] occurs.

Thus, when (CONT[1], CONT[0]) is serially varied, the amount of variation in the impedance at the oscillation output node OscP can be brought to the same value (ΔC in capacity terms herein) because the buffer circuit BF1w2 has a double weight. With this regularity, a reduction in DNL can be achieved. Incidentally, if, for example, the buffer circuit BF2w4 of FIG. 11 is also considered to be one in which the impedance thereof is (ZLOG/4) and four parasitic capacitances CPs are coupled in parallel, similar regularity can be obtained. Although the OscP side has been explained by way of example, similar regularity can of course be obtained even on the OscM side. On the other hand, in the comparative example shown in FIG. 13, a buffer circuit BF1w1 corresponding to the buffer circuit BF1w2 of FIG. 12 has the same weight as the buffer circuit BF0w1. In this case, the impedance ZRES1 at the time that the buffer circuit BF1w1 side is seen from the oscillation output node OscP is expressed in ZRES1=(1/(2·CP))+ZLOG (where frequency dependence is omitted). It becomes hard to realize such regularity as mentioned above.

As described above, a further reduction in DNL can be realized by combining such a shield system as described in the second embodiment with such a weighting system of buffer circuits as described in the third embodiment. That is, the uniformization of the capacitances CP in FIG. 12 is achieved by the above-described shield system, and weights are assigned to the buffer circuits as predicated on the uniformized CP, whereby the corresponding advantageous effect is obtained. Incidentally, although the weighting system has been applied to the second embodiment (FIG. 8) herein, beneficial effects can of course be obtained even though the weighting system is applied to the first embodiment (FIG. 4).

<<Verification Result of Layout Outline[3] of Capacitor Bank>>

Figure 14:
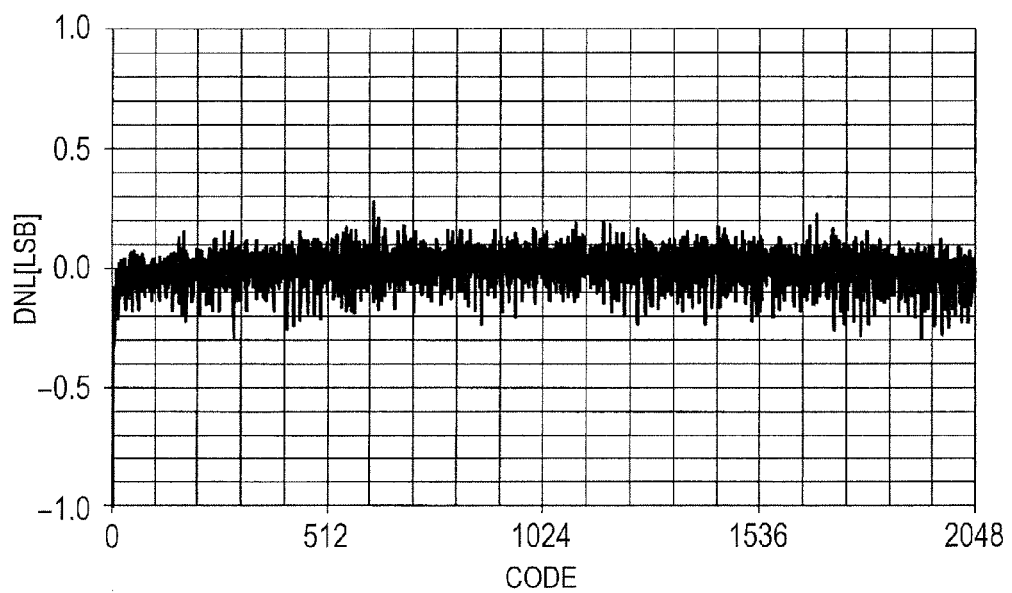
FIG. 14 is a diagram showing a verification result of DNL of the DCO circuit of FIG. 1 to which the configuration example of FIG. 11 is applied.
Figure 15:
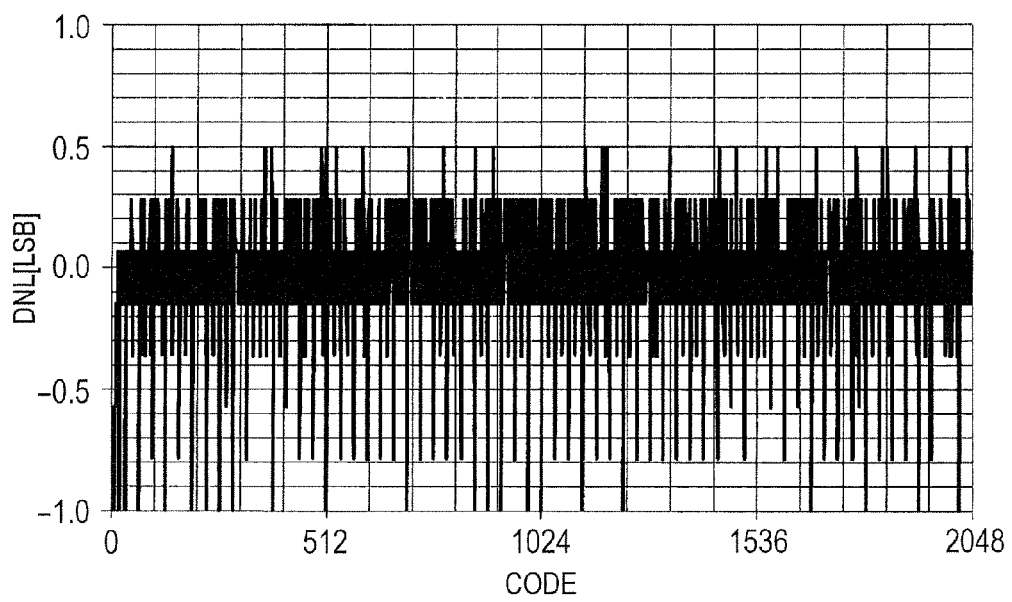
FIG. 15 is a diagram showing a verification result of DNL of a DCO circuit discussed as the premise of the present invention, as a comparative example of FIG. 14.

FIG. 14 is a diagram showing a verification result of DNL of the DCO circuit of FIG. 1 to which the configuration example of FIG. 11 is applied. FIG. 15 is a diagram showing a verification result of DNL of a DCO circuit discussed as the premise of the present invention, as a comparative example of FIG. 14. In FIGS. 14 and 15, the horizontal axis indicates a digital code (corresponding to the integer capacitance value control signal W_INT (BIT_CI) of FIG. 1), and the vertical axis indicates DNL [LSB]. First, as shown in FIG. 15, in the DCO circuit (DCO circuit unequipped with the shield system and weighting system described above) taken as a premise of the present invention, the value of DNL becomes large, and the condition of within |LSB/2| generally minimum required has not been met. On the other hand, in FIG. 14, the value of DNL is greatly reduced, and a margin is sufficiently ensured even with respect to the |LSB/2|.

Fourth Embodiment

Various Schematic Configurations of High Frequency Signal Processing Device

The fourth embodiment will explain various configuration examples of a high frequency signal processing device for various wireless communication systems (typically cellular phones) each equipped with such a digitally controlled oscillator device as described in each of the first through third embodiments.

Figure 16:
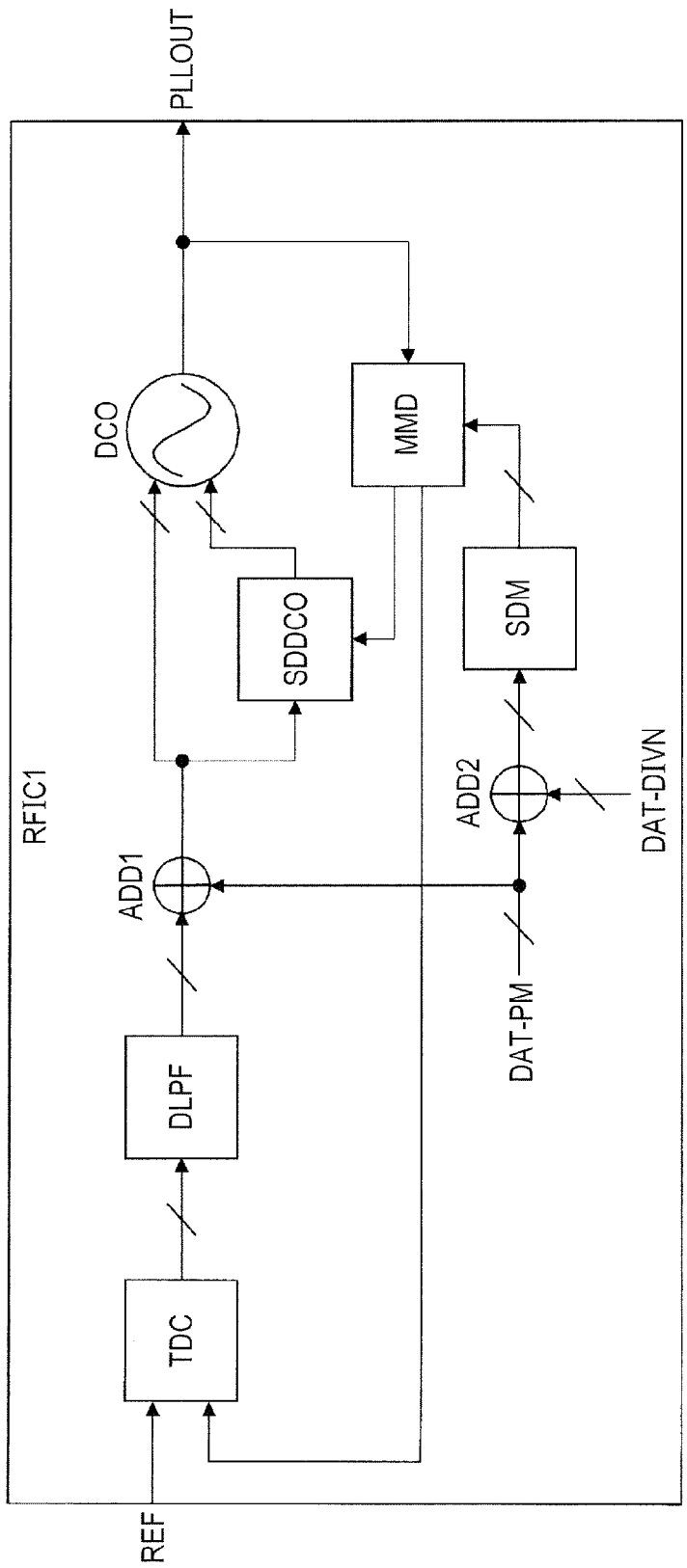
FIG. 16 is a block diagram illustrating a schematic configuration example of a high frequency signal processing device according to a fourth embodiment of the present invention.

FIG. 16 is a block diagram illustrating a schematic configuration example of a high frequency signal processing device according to the fourth embodiment of the present invention. The high frequency signal processing device RFIC1 shown in FIG. 16 is configured by one semiconductor chip, for example. The high frequency signal processing device RFIC1 is equipped with a time difference detector TDC, a digital low-pass filter DLPF, a digitally controlled oscillator circuit DCO, a multi modulus frequency divider MMD, a sigma delta modulator SDM, synthetic or additive circuits ADD1 and ADD2, and a sigma delta modulator SDDCO for the digitally controlled oscillator circuit DCO. Here, such a configuration example as described in each of the first through third embodiments is applied to the digitally controlled oscillator circuit DCO. Each circuit in the high frequency signal processing device RFIC1 configures, for example, a part of a transmission circuit in the wireless communication system.

The high frequency signal processing device RFIC1 of FIG. 16 takes a configuration in which the synthetic circuits ADD1 and ADD2 and the sigma delta modulator SDDCO are added to the digital PLL circuit DPLL described in FIG. 7. A detailed description of parts that overlap with those in FIG. 7 is omitted subsequently. The synthetic circuit ADD1 synthesizes the output of the digital low-pass filter DLPF and a phase modulation code DAT-PM, outputs a part of the result of synthesis to the digitally controlled oscillator circuit DCO, and outputs another part thereof through the sigma delta modulator SDDCO. In order to realize a high resolution frequency setting associated with the fraction capacitances (CFp and CFm in FIG. 1) in response to the output of the synthetic circuit ADD1 and the output of the multi modulus frequency divider MMD, the sigma delta modulator SDDCO determines, for example, a time width of an on level of each capacitive element in the digitally controlled oscillator circuit DCO, a timing provided to perform control to the on level, etc. That is, the on/off control signal BIT_CF in FIG. 1 is generated. The synthetic circuit ADD2 synthesizes the phase modulation code DAT-PM and a division ratio set code DAT-DIVN and inputs the result of synthesis to the sigma delta modulator SDM. As a result, an oscillation output signal PLLOUT added with the phase modulation corresponding to the phase modulation code DAT-PM with a predetermined oscillation frequency as a reference is generated from the digitally controlled oscillator circuit DCO. The oscillation output signal PLLOUT is amplified by, for example, an unillustrated power amplifier device or the like, followed by being transmitted via an antenna.

Thus, a scheme in which phase modulation associated with the phase modulation code DAT-PM is directly performed on the digitally controlled oscillator circuit DCO through the synthetic circuit ADD1, and phase modulation associated with the phase modulation code DAT-PM is performed on the multi modulus frequency divider MMD (sigma delta modulator SDM) through the synthetic circuit ADD2 is called a two point modulation scheme. If only the modulation path to the multi modulus frequency divider MMD (sigma delta modulator SDM) is taken, the corresponding path assumes a low-pass filter characteristic, and its loop band is limited to, for example, a few hundred kHz or so in terms of out-of-band noise and spurious. Therefore, high-frequency transmission data is in danger of missing (i.e., the speed-up of a transmission data rate becomes difficult). On the other hand, if only the modulation path to the digitally controlled oscillator circuit DCO is taken, the corresponding path is brought into a high-pass filter characteristic. Therefore, a low-frequency frequency component is not obtained, and a state close to open loop control is reached because of loop out-of-band control, thus causing a fear that the accuracy of modulation is degraded. Thus, if the two point modulation scheme is used, the low-pass filter characteristic and the high-pass filter characteristic are made to complement each other, so that communications in a wide band can be achieved.

If the high frequency signal processing device RFIC1 is used, a high-accuracy oscillation output signal PLLOUT small in phase error with the reduction in DNL at the digitally controlled oscillator circuit DCO can be generated in addition to the advantageous effect by the above two point modulation scheme. As a result, a high frequency signal reduced in spectrum degradation and having a high modulation accuracy (high EVM (Error Vector Magnitude) characteristic) can be transmitted through the unillustrated antenna. Incidentally, although not limited in particular, the high frequency signal processing device RFIC1 can be applied to, for example, a cellular phone system based on a GSM (Global System for Mobile Communications) standard system, in which GMSK (Gaussian filtered Minimum Shift Keying) modulation is used, a ZigBee (registered trademark) system in which OQPSK (offset quadrature phase shift keying) modulation is used, etc.

Figure 17:
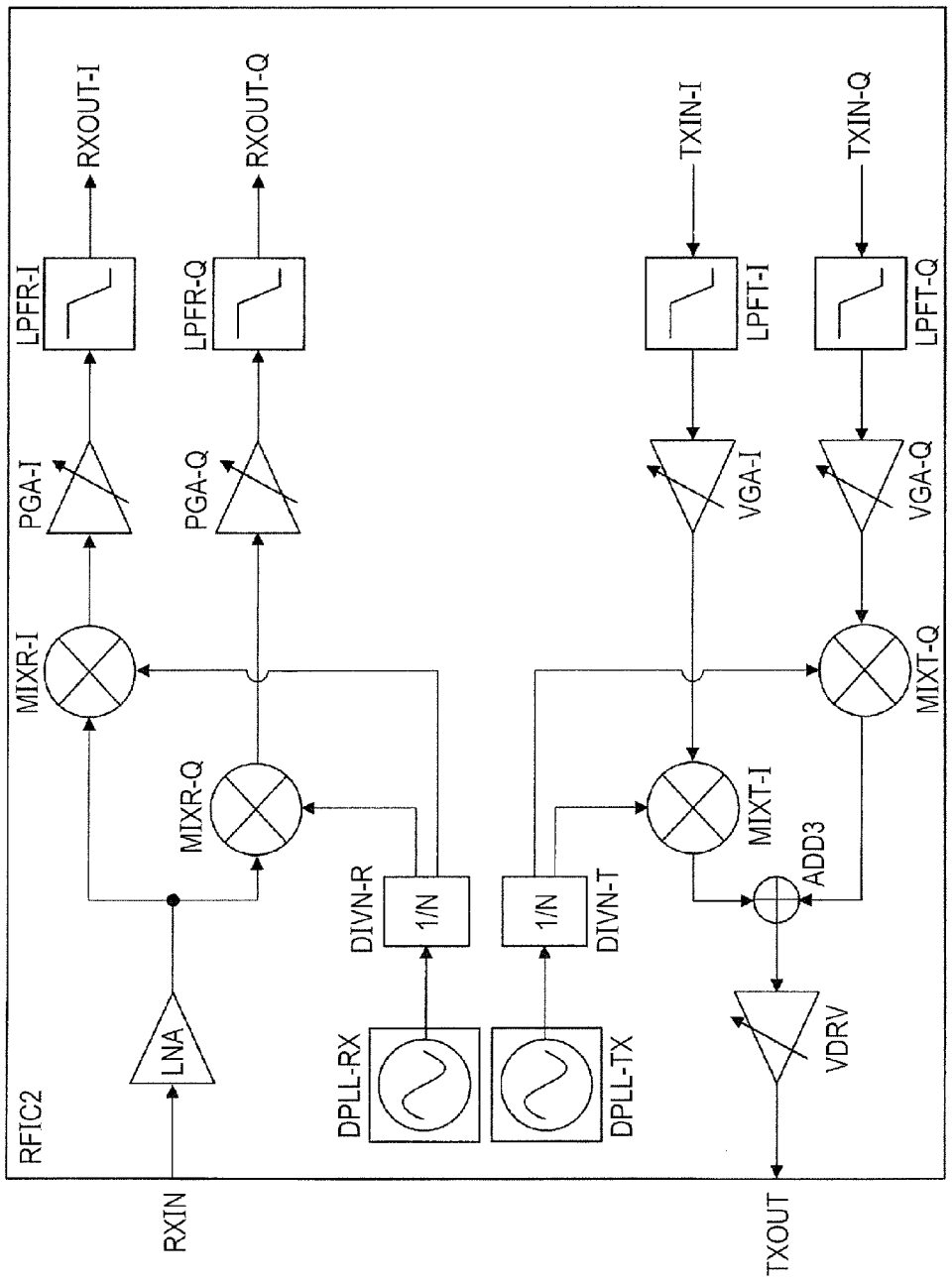
FIG. 17 is another block diagram showing a schematic configuration example of the high frequency signal processing device according to the fourth embodiment of the present invention.

FIG. 17 is another block diagram showing a schematic configuration example of the high frequency signal processing device according to the fourth embodiment of the present invention. The high frequency signal processing device RFIC2 shown in FIG. 17 is configured by, for example, one semiconductor chip. The high frequency signal processing device RFIC2 includes, as a transmission circuit, low-pass filters LPFT-I and LPFT-Q, variable amplifiers VGA-1 and VGA-Q, transmission mixers MIXT-I and MIXT-Q, a synthetic circuit ADD3, a variable driver VDRV, a transmission digital PLL circuit DPLL_TX, and a divider DIVN-T. The high frequency signal processing device RFIC2 includes, as a reception circuit, a low noise amplifier LNA, reception mixers MIXR-I and MIXR-Q, programmable gain circuits PGA-I and PGA-Q, low-pass filters LPFR-I and LPFR-Q, a reception digital PLL circuits DPLL_RX, and a divider DIVN-R., Here, such a configuration example as described in FIG. 7 showing the first embodiment is applied to the transmission digital PLL circuit DPLL_TX and the reception digital PLL circuit DPLL_RX. Such a configuration example as described in each of the first through third embodiments is applied to the digitally controlled oscillator circuit DCO shown within FIG. 7.

In FIG. 17, transmission baseband signals TXIN-I and TXIN-Q that assume orthogonal signals are transmitted through the low-pass filters LPFT-I and LPFT-Q during a transmission operation and appropriately amplified by the variable amplifiers VGA-I and VGA-Q, followed by being input to the transmission mixers MIXT-I and MIXT-Q. The transmission mixers MIXT-I and MIXT-Q upconvert (frequency-convert) the transmission baseband signals outputted via the variable amplifiers VGA-I and VGA-Q to predetermined high frequency signals, using local signals (carrier signal and local oscillation signal) outputted from the divider DIVN-T. At this time, the divider DIVN-T suitably divides an oscillation output signal outputted from the transmission digital PLL circuit DPLL_TX and besides generates two local signals different 90° in phase. The divider DIVN-T outputs one of them to the transmission mixer MIXT-I and outputs the other thereof to the transmission mixer MIXT-Q. The synthetic circuit ADD3 performs vector synthesis of the output of the transmission mixer MIXT-I and the output of the transmission mixer MIXT-Q. The variable driver VDRV amplifies the vector-synthesized high frequency signal with prescribed gain and thereby generates a transmission high frequency signal TXOUT. The high frequency signal TXOUT is amplified by an unillustrated power amplifier device or the like and transmitted through the antenna.

In FIG. 17, during a reception operation, a reception high frequency signal RXIN received by the unillustrated antenna is inputted to the low-noise amplifier LNA. The high frequency signal amplified by the low-noise amplifier LNA is inputted to the reception mixers MIXR-I and MIXR-Q. The reception mixers MIXR-I and MIXR-Q downconvert (frequency-convert) the high frequency signal outputted from the low-noise amplifier LNA into predetermined baseband signals, using local signals (carrier signal and local oscillation signal) outputted from the divider DIVN-R. At this time, the divider DIVN-R suitably divides an oscillation output signal outputted from the reception digital PLL circuit DPLL_RX and besides generates two local signals different 90° in phase. The divider DIVN-R outputs one of them to the reception mixer MIXR-I and outputs the other thereof to the reception mixer MIXR-Q. The signals outputted from the reception mixers MIXR-I and MIXR-Q are appropriately amplified by the programmable gain circuits PGA-I and PGA-Q, followed by being outputted via the low-pass filters LPFR-I and LPFR-Q. The output signals become reception baseband signals RXOUT-I and RXOUT-Q corresponding to orthogonal signals.

Using the high frequency signal processing device RFIC2 of FIG. 17 enables the generation of the high-accuracy local signals small in phase error with the transmission digital PLL circuit DPLL_TX during the transmission operation, for example, thereby making it possible to achieve a reduction in the phase error at the transmission high frequency signal, an improvement in spectrum and so on. Since the local signals small in phase noise can be generated with the reception digital PLL circuit DPLL_RX during the reception operation, a reduction in BER (Bit Error Rate) and the like can be achieved. Incidentally, since the various phase modulation or amplitude modulation in addition to it can be realized, the high frequency signal processing device RFIC2 can be applied to various cellular phone systems like so-called 2G (e.g., GSM standard), 3G (e.g., W-CDMA (Wideband Code Division Multiple Access) standard) and 3.9G (e.g., LTE (Long Term Evolution) standard). Of course, the high frequency signal processing device is not limited to the cellular phone systems, but applicable to various wireless communication systems such as a wireless LAN (Local Area Network), Bluetooth (registered trademark), and ZigBee (registered trademark) systems.

Figure 18:
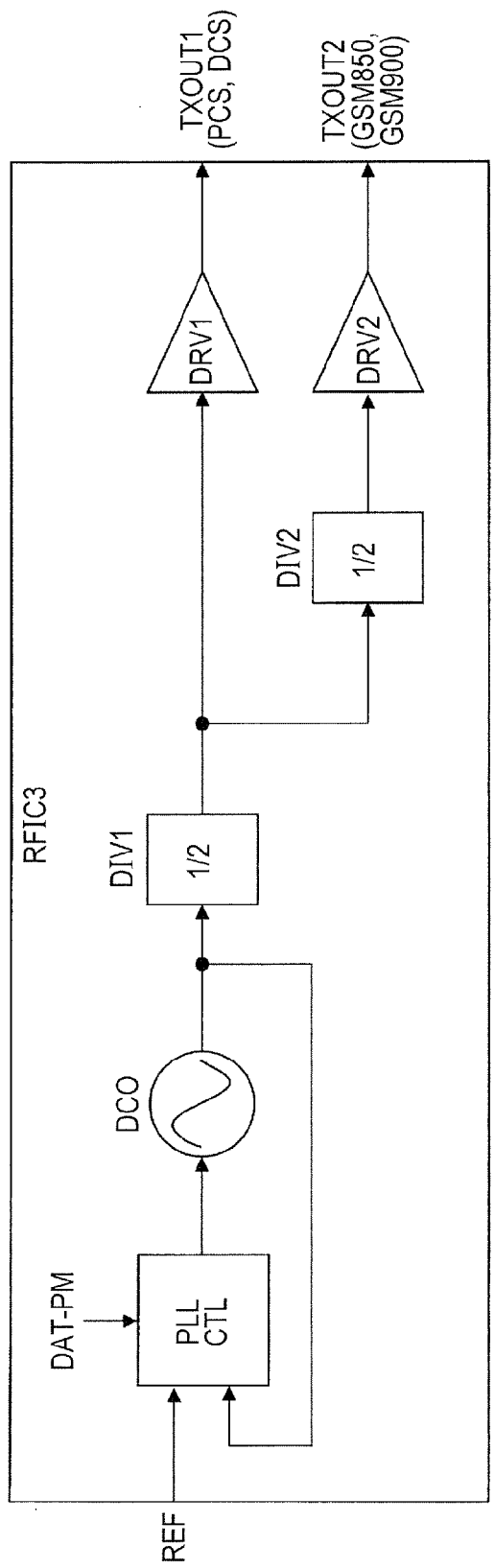
FIG. 18 is a further block diagram illustrating a schematic configuration example of the high frequency signal processing device according to the fourth embodiment of the present invention.

FIG. 18 is a further block diagram illustrating a schematic configuration example of the high frequency signal processing device according to the fourth embodiment of the present invention. The high frequency signal processing device RFIC3 shown in FIG. 18 is configured by one semiconductor chip, for example. The high frequency signal processing device RFIC3 is equipped with a PLL controller PLLCTL, a digitally controlled oscillator circuit DCO, dividers DIV1 and DIV2, and drivers DRV1 and DRV2. Here, such a configuration example as described in each of the first through third embodiments is applied to the digitally controlled oscillator circuit DCO. Each circuit in the high frequency signal processing device RFIC3 configures a part of a transmission circuit in a wireless communication system, for example.

The PLL controller PLLCTL includes, for example, a phase comparator, a loop filter circuit, a divider and so on. The PLL controller PLLCTL generates a division signal having a predetermined division ratio in response to an oscillation output signal sent from the digitally controlled oscillator circuit DCO and controls the oscillation frequency of the digitally controlled oscillator circuit DCO in such a manner that the phase of the division signal and the phase of a reference oscillation signal REF coincide with each other. The PLL controller PLLCTL inputs a phase modulation code DAT-PM therein and performs modulation, based on the phase modulation code DAT-PM. Specifically, the PLL controller PLLCTL performs direct modulation on the digitally controlled oscillator circuit DCO or performs such two-point modulation as described in FIG. 16. It is known that MSK (Minimum Shift Keying) modulation is enabled by performing FSK (frequency shift keying) in which a modulation index is 0.5, for example. This is combined with a Gaussian filter to thereby enable GMSK modulation used in the GSM standard or the like.

The divider DIV1 ½-divides the oscillation output signal of such a digitally controlled oscillator circuit DCO, for example. The driver DRV1 outputs a transmission high frequency signal TXOUT1 in response to the output of the divider DIV1. The transmission high frequency signal TXOUT1 is amplified by an unillustrated power amplifier or the like, followed by being transmitted via the corresponding antenna. The transmission high frequency signal TXOUT1 is, for example, a signal based on a PCS (Personal Communication Service) standard having a transmission frequency band ranging from 1850 MHz to 1910 MHz and a reception frequency band ranging from 1930 MHz to 1990 MHz, or a DCS (Digital Cellular System) standard having a transmission frequency band ranging from 1710 MHz to 1785 MHz and a reception frequency band ranging from 1805 MHz to 1880 MHz. Incidentally, each of the PCS standard and the DCS standard is also called a high band based on the GSM standard, or the like.

The divider DIV2 performs, for example, a further ½-division on the output signal of the divider DIV1. The divider DRV2 outputs a transmission high frequency signal TXOUT2 in response to the output of the divider DIV2. The transmission high frequency signal TXOUT2 is amplified by an unillustrated power amplifier or the like, followed by being transmitted via the corresponding antenna. The transmission high frequency signal TXOUT2 is, for example, a signal based on a GSM850 standard having a transmission frequency band ranging from 824 MHz to 849 MHz and a reception frequency band ranging from 869 MHz to 894 MHz, or a GSM900 standard having a transmission frequency band ranging from 880 MHz to 915 MHz and a reception frequency band ranging from 925 MHz to 960 MHz. Incidentally, either one of the drivers DRV1 and DRV2 is activated according to the setting of a communication mode. When the high frequency signal processing device RFIC3 of FIG. 18 is used, a high-accuracy oscillation output signal small in phase error with a reduction in DNL at the digitally controlled oscillator circuit DCO can be generated. As a result, a high frequency signal low in spectrum degradation and having a high modulation accuracy (high EVM characteristic) can be transmitted through the unillustrated antenna.

Figure 19:
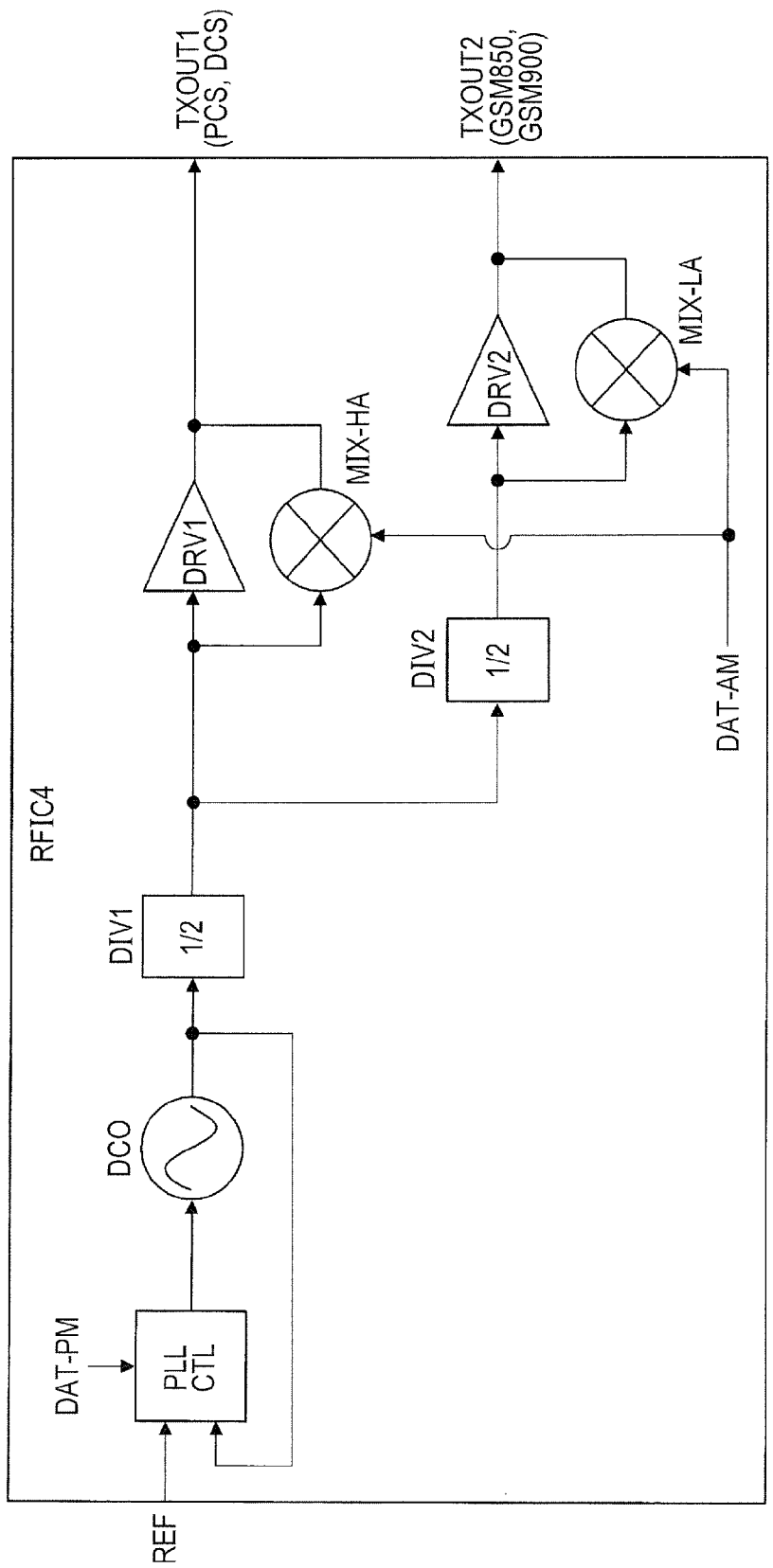
FIG. 19 is a yet another block diagram showing a schematic configuration example of the high frequency signal processing device according to the fourth embodiment of the present invention.

FIG. 19 is a yet another block diagram showing a schematic configuration example of the high frequency signal processing device according to the fourth embodiment of the present invention. The high frequency signal processing device RFIC4 shown in FIG. 19 is configured by one semiconductor chip, for example. The high frequency signal processing device RFIC4 takes a configuration in which two amplitude modulation mixers MIX-HA and MIX-LA are added to the high frequency signal processing device RFIC3. The high frequency signal processing device RFIC4 is similar to that of FIG. 18 in configuration other than it, and its detailed description will therefore be omitted. The amplitude modulation mixer MIX-HA is provided in parallel with the input/output of the driver DRV1. The amplitude modulator mixer MIX-HA amplitude-modulates the output of the divider DIV1 with an amplitude modulation code DAT-AM and outputs the result of amplitude-modulation as a TXOUT1. Likewise, the amplitude modulation mixer MIX-LA is provided in parallel with the input/output of the driver DRV2. The amplitude modulator mixer MIX-LA amplitude-modulates the output of the divider DIV2 with the amplitude modulation code DAT-AM and outputs the result of amplitude-modulation as a TXOUT2.

Any one of the driver DRV1, the amplitude modulation mixer MIX-HA, the driver DRV2 and the amplitude modulation mixer MIX-LA is activated. When the driver DRV1 is activated, the signal based on such a PCS or DCS standard as described above is outputted as TXOUT1. When the driver DRV2 is activated, the signal based on such a GSM850 or GSM900 standard as described above is outputted as TXOUT2. On the other hand, when the amplitude modulation mixer MIX-HA is activated, a signal of an EDGE (Enhanced Data rates for GSM Evolutions) mode based on the PCS standard or the DCS standard is outputted as TXOUT1. When the amplitude modulation mixer MIX-LA is activated, a signal of an EDGE mode based on the GSM850 or GSM900 standard is outputted as TXOUT2. Since 8PSK (Phase Shift Keying) modulation or the like which causes a comprehensive-line fluctuation unlike GMSK modulation which causes no comprehensive-line fluctuation is used in the EDGE mode, amplitude control by each of the amplitude modulation mixers MIX-HA and MIX-LA is needed.

Using the high frequency signal processing device according to the fourth embodiment as described above makes it possible to achieve improvements in modulation accuracy and demodulation accuracy in addition to the accuracy of setting of the oscillation frequency. Typically, it is therefore possible to improve the quality of a transmission signal and a reception signal.

Although the invention made above by the present inventors has been described specifically on the basis of the preferred embodiments, the present invention is not limited to the embodiments referred to above. Various changes can be made thereto within the scope not departing from the gist thereof. For example, although the digitally controlled oscillator circuit according to the present embodiment has been applied to the wireless communication systems herein, it can also be applied to a cable communication system as the case may be.

What is claimed is:
1. A semiconductor device comprising:
a low noise amplifier configured to amplify a radio frequency signal inputted from an antenna;
a first reception mixer coupled with the low noise amplifier;
a reception digital PLL circuit including a first digitally controlled oscillator circuit; and
a reception divider coupled with the reception digital PLL circuit and the first reception mixer,
wherein the first digitally controlled oscillator circuit includes:
first and second oscillation output nodes from which complementary oscillation output signals are output;
coil elements coupled between the first oscillation output node and the second oscillation output node; and
a plurality of capacitor units coupled in parallel between the first oscillation output node and the second oscillation output node, and controlled through a plurality of control lines,
wherein a first shield layer is disposed between the control lines and the first and second oscillation output nodes in such a manner as to effectively shield between the control lines and the first and second oscillation output nodes.
2. A semiconductor device according to claim 1,
wherein the first digitally controlled oscillator circuit further includes a negative resistance generating circuit which generates a negative resistance between the first oscillation output node and the second oscillation output node, and a control circuit which controls the capacitor units through the control lines.
3. A semiconductor device according to claim 1,
wherein each of the capacitor units includes capacitive elements and a control node which is coupled to one of the control lines to select whether the capacitive elements are coupled to the first and second oscillation output nodes as set parameters for an oscillation frequency.
4. A semiconductor device according to claim 1, further comprising:
a first programmable gain circuit coupled with the first reception mixer; and
a first low-pass filter coupled with the first programmable gain circuit.
5. A semiconductor device according to claim 4, further comprising:
a second reception mixer coupled with the low noise amplifier;
a second programmable gain circuits coupled with the second reception mixer; and
a second low-pass filter coupled with the second programmable gain circuits.
6. A semiconductor device according to claim 1, further comprising:
a variable driver configured to generate a transmission radio frequency signal;
a first transmission mixer coupled with the variable driver;
a transmission digital PLL circuit including a second digitally controlled oscillator circuit; and
a transmission divider coupled with the transmission digital PLL circuit and the first transmission mixer.
7. A semiconductor device according to claim 1,
wherein a part of the first shield layer is disposed so as to surround all the peripheries of the control lines over a section.
8. A semiconductor device according to claim 1,
wherein the control lines include first and second control lines, wherein the first control line is coupled to the control nodes of $2^N$ (where N: integer equal to or greater than 0) capacitor units of the capacitor units, wherein the second control line is coupled to the control nodes of $2^M$ (where M: integer equal to or greater than 0) capacitor units of the capacitor units, wherein the control circuit includes a first buffer circuit which drives the first control line, and a second buffer circuit which drives the second control line, and wherein a drive capacity of the second buffer circuit is $2^{(M-N)}$ times a drive capacity of the first buffer circuit.

* * * * *